(12) United States Patent
Furuhata

(10) Patent No.: US 9,829,505 B2
(45) Date of Patent: Nov. 28, 2017

(54) ELECTRONIC DEVICE, ELECTRONIC APPARATUS, AND MOVING OBJECT

(71) Applicant: Seiko Epson Corporation, Tokyo (JP)

(72) Inventor: Makoto Furuhata, Matsumoto (JP)

(73) Assignee: Seiko Epson Corporation (JP)

( * ) Notice: Subject to any disclaimer, the term of this patent is extended or adjusted under 35 U.S.C. 154(b) by 135 days.

(21) Appl. No.: 14/658,364

(22) Filed: Mar. 16, 2015

(65) Prior Publication Data

US 2015/0268266 A1   Sep. 24, 2015

(30) Foreign Application Priority Data

Mar. 18, 2014   (JP) ................................ 2014-054492

(51) Int. Cl.
  *G01P 15/08*     (2006.01)
  *G01C 19/56*    (2012.01)
  *G01P 15/18*     (2013.01)
  *G01C 19/5783*  (2012.01)

(52) U.S. Cl.
  CPC .......... *G01P 15/18* (2013.01); *G01C 19/5783* (2013.01); *G01P 15/08* (2013.01); *H01L 2224/48091* (2013.01); *H01L 2224/48227* (2013.01); *H01L 2224/49109* (2013.01); *H01L 2224/73265* (2013.01); *H01L 2924/181* (2013.01)

(58) Field of Classification Search
  CPC ....................... G01C 19/5783; G01P 2015/088
  USPC ........................................................ 73/493
  See application file for complete search history.

(56) References Cited

U.S. PATENT DOCUMENTS

| | | | | |
|---|---|---|---|---|
| 5,095,752 | A | * | 3/1992 | Suzuki ................ G01P 15/0802 361/280 |
| 6,890,834 | B2 | | 5/2005 | Komobuchi et al. |
| 6,965,107 | B2 | | 11/2005 | Komobuchi et al. |
| 7,004,025 | B2 | | 2/2006 | Tamura |
| 7,159,459 | B2 | | 1/2007 | Gogoi |
| 8,084,332 | B2 | * | 12/2011 | Nasiri ................ B81C 1/00238 257/E21.499 |

(Continued)

FOREIGN PATENT DOCUMENTS

| | | |
|---|---|---|
| EP | 2375219 A1 | 10/2011 |
| JP | 11-083886 A | 3/1999 |

(Continued)

*Primary Examiner* — John Chapman, Jr.
(74) *Attorney, Agent, or Firm* — Harness, Dickey & Pierce, P.L.C.

(57) ABSTRACT

An electronic device includes an accommodation space formed between a first base material and a second base material so as to seal a space therebetween, and a functional element in the accommodation space. The accommodation space is formed in an inner region of a bonding portion between the first base material and the second base material. The electronic device includes wirings extending from the inner region through the bonding portion to the outside of the accommodation space. The bonding portion includes a first bonding region and a second bonding region. The wiring includes a first wiring portion having a first direction toward the outside through the first bonding region from the inner region and a second wiring portion having a second direction toward the outside through the second bonding region from the inner region. The first and the second directions are different.

17 Claims, 12 Drawing Sheets

(56) References Cited

U.S. PATENT DOCUMENTS

| | | |
|---|---|---|
| 8,250,920 B2 | 8/2012 | Yamanaka et al. |
| 8,283,738 B2 | 10/2012 | Fujii et al. |
| 8,438,718 B2 | 5/2013 | Aono et al. |
| 2002/0051258 A1 | 5/2002 | Tamura |
| 2003/0183921 A1 | 10/2003 | Komobuchi et al. |
| 2004/0173751 A1 | 9/2004 | Komobuchi et al. |
| 2009/0183568 A1 | 7/2009 | Yamanaka et al. |
| 2010/0176466 A1 | 7/2010 | Fujii et al. |
| 2011/0209815 A1 | 9/2011 | Aono et al. |
| 2012/0111615 A1 | 5/2012 | Yoda et al. |
| 2013/0265701 A1* | 10/2013 | Takizawa ............... H05K 5/069 361/679.01 |
| 2013/0285172 A1 | 10/2013 | Jeong et al. |
| 2013/0312517 A1 | 11/2013 | Jeong et al. |

FOREIGN PATENT DOCUMENTS

| | | |
|---|---|---|
| JP | 2002-005950 A | 1/2002 |
| JP | 2003-100919 A | 4/2003 |
| JP | 2009-168777 A | 7/2009 |
| JP | 2011-179821 A | 9/2011 |
| JP | 2012-088319 A | 5/2012 |
| JP | 2012-098208 A | 5/2012 |
| JP | 2012-122745 A | 6/2012 |
| JP | 2012-168097 A | 9/2012 |
| WO | WO-2010-119573 A1 | 10/2010 |

* cited by examiner

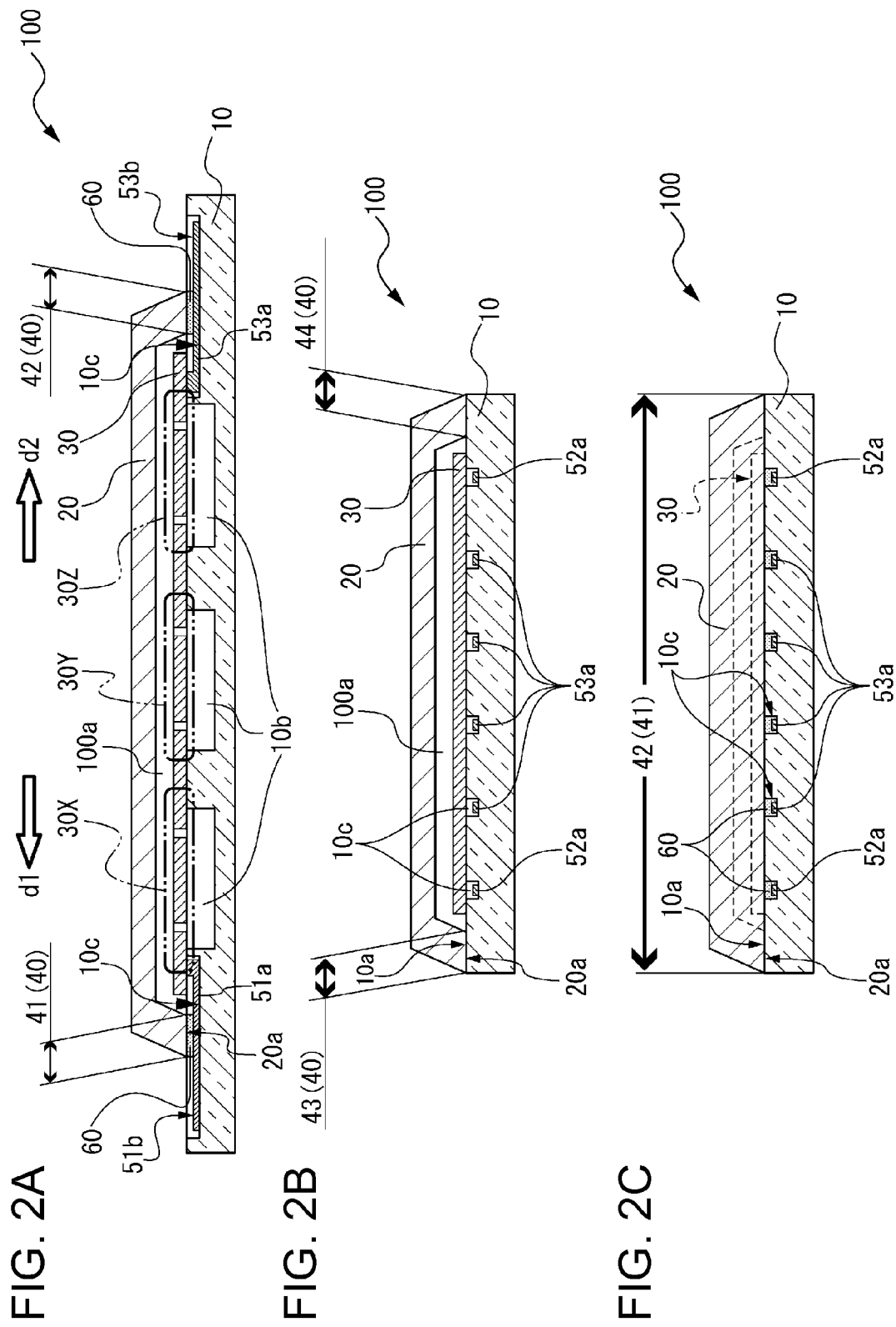

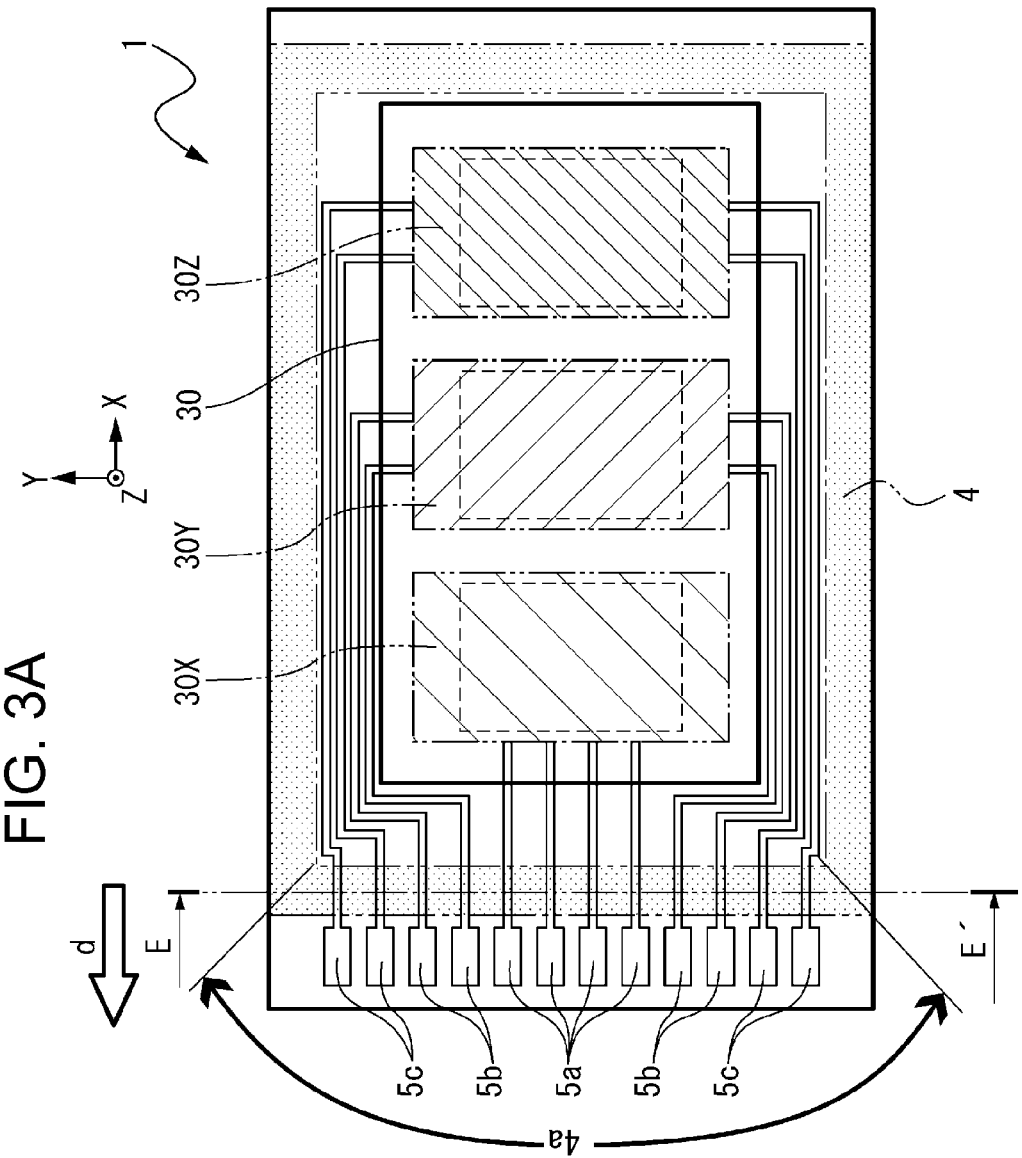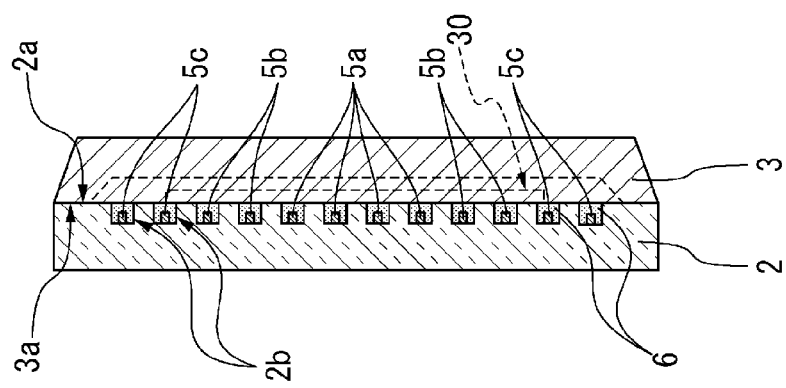

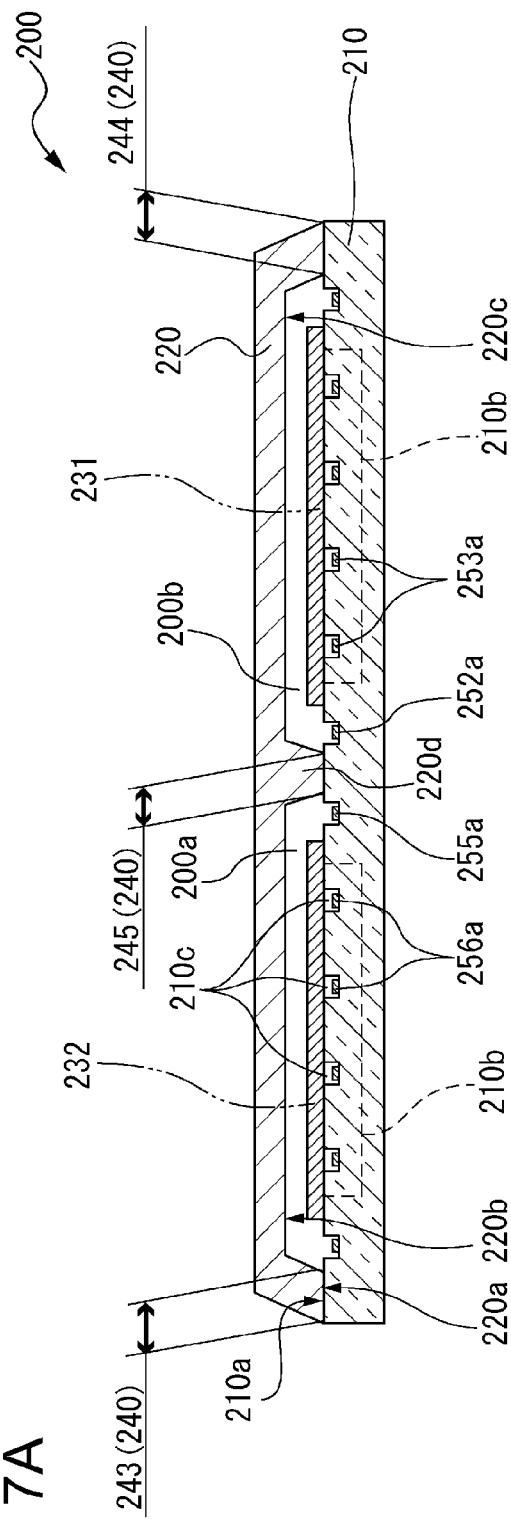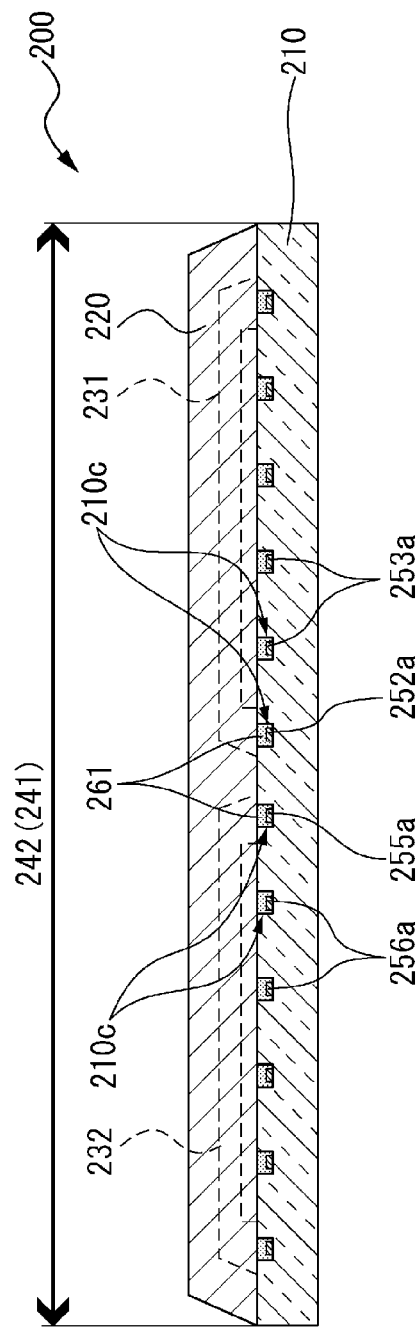

ELECTRONIC DEVICE, ELECTRONIC APPARATUS, AND MOVING OBJECT

CROSS-REFERENCE TO RELATED APPLICATIONS

This application claims priority to Japanese Patent Application No. 2014-054492 filed on Mar. 18, 2014. The entire disclosure of Japanese Patent Application No. 2014-054492 is hereby incorporated herein by reference.

BACKGROUND

1. Technical Field

The present invention relates to an electronic device, an electronic apparatus, and a moving object.

2. Related Art

In recent years, electronic devices including a functional element, detecting a physical quantity, which is formed by a microelectromechanical systems (MEMS) technique using a semiconductor manufacturing method which is one of precise machining techniques have been developed as small-sized sensor devices. As the functional element, there has been known, for example, a physical quantity sensor element including a fixed electrode which is fixedly disposed and a movable electrode which is opposite to the fixed electrode at a predetermined interval and is provided so as to be displaceable and detecting a physical quantity such as acceleration or an angular velocity on the basis of capacitance between the fixed electrode and the movable electrode.

A composite sensor element formed by combining an acceleration sensor and an angular velocity sensor has been proposed as a composite sensor element formed by combining the physical quantity sensors and is disclosed as a motion detection sensor (JP-A-2002-005950).

In a method of manufacturing a functional element using a MEMS technique, the functional element is firmly fixed onto an insulating substrate such as, for example, glass, and micromachining is performed thereon. A conductive wiring for the input of a driving signal for driving the functional element or for the output of a detected signal based on a physical quantity detected is connected to the formed functional element, and it is disclosed that the conductive wiring is disposed so as to be drawn into a groove portion formed on one side of the insulating substrate (JP-A-2012-098208).

As disclosed in JP-A-2002-005950 and JP-A-2012-098208, the functional element is disposed in an accommodation space formed between a substrate and a lid member bonded to the substrate, and the inside of the accommodation space is maintained airtight. However, as disclosed in JP-A-2012-098208, a configuration is adopted in which the conductive wiring is disposed at the groove formed in the substrate, and the wiring is drawn to an electrode serving as a portion electrically connected to the outside. Thus, a portion (gap) where the accommodation space communicates with the outside is generated in a bonding portion between the substrate and the lid member (see FIG. 6 of JP-A-2012-098208) and is filled with an adhesive or the like to maintain airtightness.

However, as disclosed in JP-A-2012-098208, a plurality of wirings where the accommodation space communicates with the outside are provided in the bonding portion between the substrate and the lid member on only one side of the substrate when seen in a plan view. In addition, there is a tendency for a bonding state at a location at which the substrate and the lid member are bonded to each other to be different from a bonding state at a location at which a wiring is provided between the substrate and the lid member. Accordingly, the bonding state between the substrate and the lid member becomes unstable, and thus there is a concern of airtightness being deteriorated.

SUMMARY

An advantage of some aspects of the invention is to provide an electronic device capable of reducing the deterioration of airtightness in a functional element accommodation space of the electronic device even when a plurality of wirings extracted to the outside are present.

The invention can be implemented as the following forms or application examples.

Application Example 1

This application example is directed to an electronic device including a first base material; a second base material, having an accommodation space formed between the first base material and the second base material, which is bonded to the first base material through a bonding portion; and a functional element which is accommodated in the accommodation space. The first base material or the second base material is provided with a wiring which is electrically connected to the functional element and extends to the outside of the accommodation space through the bonding portion. The bonding portion includes a first bonding region and a second bonding region. The wiring includes a first wiring portion having a first direction toward the outside of the accommodation space through the first bonding region and a second wiring portion having a second direction toward the outside of the accommodation space through the second bonding region, and the first direction and the second direction are different directions.

According to the electronic device of this application example, the wiring portions connected to the functional element and extending to the first base material are distributed into the first wiring portion extending to the outside of the accommodation space through the first bonding region and the second wiring portion extending to the outside of the accommodation space through the second bonding region. Thereby, a bonding area between the first wiring portion and the second wiring portion can be increased, and thus it is possible to reduce the deterioration of bonding strength between the first base material and the second base material in the first and second bonding regions.

Application Example 2

This application example is directed to the application example described above, wherein at least one of the first wiring portion and the second wiring portion includes a plurality of wirings.

According to this application example, even when the plurality of wirings extending from the accommodation space through the first and second bonding regions to the outside are present, the plurality of wirings are disposed so as to be distributed to the first bonding region and the second bonding region, and thus it is possible to reduce the narrowing of a gap between the wirings and to increase a bonding area of the gap between the wirings. In addition, it is possible to dispose a well-balanced bonding strength in the bonding region between the first base material and the second base material.

Application Example 3

This application example is directed to the application example described above, wherein the first base material or the second base material includes a partition wall portion, and the accommodation space is partitioned into a first accommodation space and a second accommodation space by the partition wall portion. The functional element includes a first functional element and a second functional element. The first accommodation space accommodates the first functional element. The second accommodation space accommodates the second functional element. The first accommodation space and the second accommodation space have different internal environments.

According to this application example, it is possible to obtain the electronic device having functional elements with different functions being combined with each other. In addition, the number of wirings extending from the accommodation space through the first and second bonding regions to the outside is increased by combining the functional elements with each other. However, even when the number of wirings is increased, the wirings can be disposed so as to be distributed to the first bonding region and the second bonding region. Thus, it is possible to dispose a well-balanced bonding strength in the bonding region between the first base material and the second base material.

Application Example 4

This application example is directed to the application example described above, wherein the first functional element is an angular velocity sensor element, and the second functional element is an acceleration sensor element. The internal environment of the first accommodation space has a decompressed atmosphere, and the internal environment of the second accommodation space has a barometric atmosphere.

According to this application example, it is possible to configure an angular velocity sensor element and an acceleration sensor element, which are mounted to an apparatus such as a posture control system or a positioning system, as one device. In addition, the number of wirings extending from the accommodation space through the first and second bonding regions to the outside is increased by combining the angular velocity sensor element and the acceleration sensor element. However, even when the number of wirings is increased, the wirings can be disposed so as to be distributed to the first bonding region and the second bonding region. Thus, it is possible to dispose a well-balanced bonding strength in the bonding region between the first base material and the second base material.

Application Example 5

This application example is directed to the application example described above, wherein at least one of the first base material and the second base material has at least one groove portion in at least one of the first bonding region and the second bonding region. At least one of the first wiring portion and the second wiring portion is disposed in the groove portion.

According to this application example, the first or second wiring portion is formed in the groove portion formed in the first or second base material, and thus a gap is generated between the groove portion and the first base material or the second base material in the bonding region between the first base material and the second base material. The gap is airtightly sealed with a sealing member, and there is a tendency for the bonding strength between the sealing member and the first base material or the second base material to be different from that of a portion where the first base material and the second base material are bonded together. However, distribution into a first wiring extending to the outside of the accommodation space through the first bonding region and a second wiring extending to the outside of the accommodation space through the second bonding region is performed. Thereby, a difference in bonding strength between a portion where the first base material and the second base material are bonded together and a portion having the groove portion is distributed to the first and second bonding regions, and thus it is possible to maintain a balance of the bonding strength between the first base material and the second base material and to reduce the deterioration of the bonding strength.

Application Example 6

This application example is directed to the application example described above, wherein the first bonding region and the second bonding region are disposed opposite to each other through the accommodation space.

According to this application example, it is possible to suitably maintain a balance of the bonding strength between the first base material and the second base material.

Application Example 7

This application example is directed to the application example described above, wherein the first bonding region is provided on the first accommodation space side with respect to the partition wall portion, and the second bonding region is provided on the second accommodation space side with respect to the partition wall portion.

According to this application example, since the wirings from the functional element accommodated in the first accommodation space extend to the outside from the first bonding region provided on the first accommodation space side, it is possible to reduce the lengths of the wirings ranging from the functional element to the outside and to achieve a decrease in a wiring resistance value or a reduction in parasitic capacitance. Similarly, also in the second accommodation space, since the wirings from the functional element accommodated in the second accommodation space extend to the outside from the second bonding region provided on the second accommodation space side, it is possible to reduce the lengths of the wirings ranging from the functional element to the outside and to achieve a decrease in a wiring resistance value or a reduction in parasitic capacitance. Accordingly, it is possible to obtain the electronic device which is stable and has high accuracy.

Application Example 8

This application example is directed to the application example described above, wherein the number of wirings provided in the first wiring portion is the same as the number of wirings provided in the second wiring portion.

According to this application example, it is possible to suitably maintain a balance of the bonding strength between the first base material and the second base material.

Application Example 9

This application example is directed to the application example described above, wherein the angular velocity sensor detects a plurality of rotation axes.

According to this application example, the number of wirings is increased in response to the detected rotation axes.

However, even when the number of wirings is increased, the wirings can be disposed by being distributed to the first bonding region and the second bonding region, and thus it is possible to dispose a well-balanced bonding strength in the bonding region between the first base material and the second base material.

Application Example 10

This application example is directed to the application example described above, wherein the acceleration sensor detects a plurality of axial directions.

According to this application example, the number of wirings is increased in response to the detected axial directions. However, even when the number of wirings is increased, the wirings can be disposed by being distributed to the first bonding region and the second bonding region, and thus it is possible to dispose a well-balanced bonding strength in the bonding region between the first base material and the second base material.

Application Example 11

This application example is directed to an electronic apparatus including the electronic device described above.

According to the electronic apparatus of this application example, in the electronic device provided therein, even when a large number of wirings are disposed in the bonding region between the first base material and the second base material which constitute the accommodation space accommodating the functional element, it is possible to dispose the large number of wirings so as to be distributed to the first bonding region and the second bonding region in the bonding region, to dispose a well-balanced bonding strength in the bonding region between the first base material and the second base material, and to stably maintain the degree of airtightness in the accommodation space. Accordingly, it is possible to obtain the electronic apparatus capable of realizing a stable operation.

Application Example 12

This application example is directed to a moving object including the electronic device described above.

According to the moving object of this application example, in the electronic device provided therein, even when a large number of wirings are disposed in the bonding region between the first base material and the second base material which constitute the accommodation space accommodating the functional element, it is possible to dispose the large number of wirings so as to be distributed to the first bonding region and the second bonding region in the bonding region, to dispose a well-balanced bonding strength in the bonding region between the first base material and the second base material, and to stably maintain the degree of airtightness in the accommodation space. Accordingly, it is possible to obtain the moving object capable of realizing a stable operation.

BRIEF DESCRIPTION OF THE DRAWINGS

The invention will be described with reference to the accompanying drawings, wherein like numbers reference like elements.

FIG. 1A is a plan view in a state where a second base material is omitted, and FIG. 1B is a cross-sectional view of a portion A-A' shown in FIG. 1A.

FIGS. 2A to 2C show the electronic device according to the first embodiment; FIG. 2A is an enlarged cross-sectional view of a portion B-B' shown in FIG. 1A, FIG. 2B is an enlarged cross-sectional view of a portion C-C' shown in FIG. 1A, and FIG. 2C is an enlarged cross-sectional view of a portion D-D' shown in FIG. 1A.

FIGS. 3A and 3B show a sensor device of the related art; FIG. 3A is a plan view in a state where a second base material is omitted, and FIG. 3B is a cross-sectional view of a portion E-E' shown in FIG. 3A.

FIG. 6A is a cross-sectional view of a portion F-F' shown in FIG. 5, and FIG. 6B is a cross-sectional view of a portion G-G' and a portion H-H' shown in FIG. 5.

FIGS. 7A and 7B show the electronic device according to the second embodiment; FIG. 7A is a cross-sectional view of a portion J-J' shown in FIG. 5, and FIG. 7B is a cross-sectional view of a portion K-K' shown in FIG. 5.

FIG. 8A is a plan view in which a second base material is omitted, and FIG. 8B is a cross-sectional view of a portion L-L' shown in FIG. 8A.

FIG. 9A is a plan view in which a mold member is omitted, and FIG. 9B is a cross-sectional view of a portion L-L' shown in FIG. 9A.

DESCRIPTION OF EXEMPLARY EMBODIMENTS

Figure 1A:
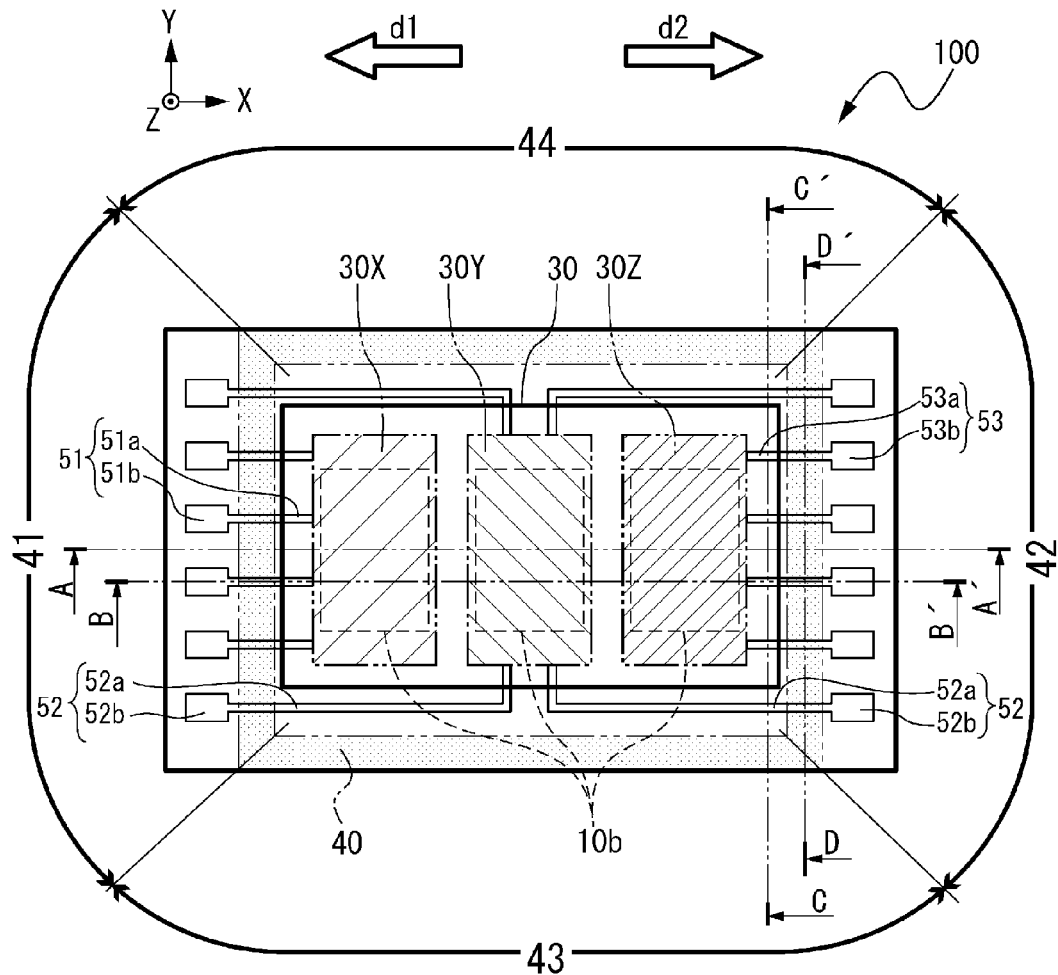
FIGS. 1A and 1B show an electronic device according to a first embodiment.
Figure 1B:
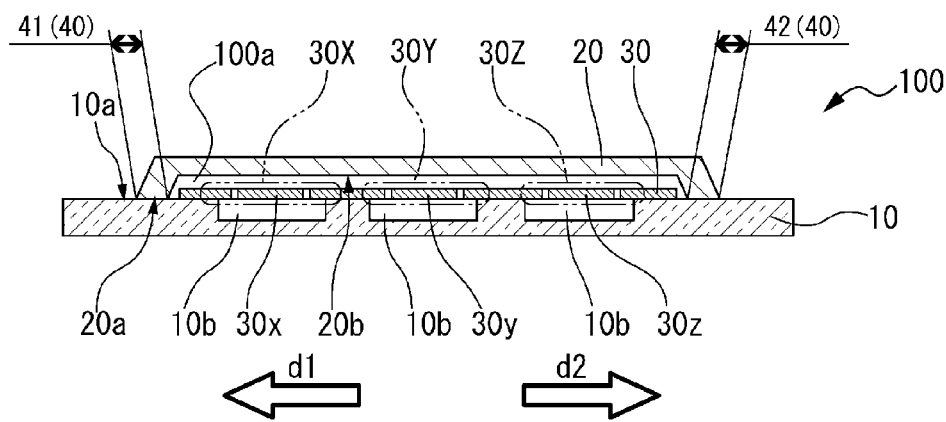

Hereinafter, embodiments according to the invention will be described with reference to the accompanying drawings.
First Embodiment FIGS. 1A and 1B show an electronic device according to a first embodiment. FIG. 1A is a plan view in a state where a second base material is omitted, and FIG. 1B is a cross-sectional view of a portion A-A' shown in FIG. 1A.

As shown in FIG. 1B, a sensor device 100 as the electronic device according to the first embodiment includes a first base material 10, a second base material 20, and a sensor element 30 as a functional element. The second base material 20 includes a concave portion 20b formed on the side of a principal surface 20a which is one surface of the second base material 20. A principal surface 10a which is one surface of the first base material 10 is bonded to the principal surface 20a of the second base material 20. The sensor element 30 is accommodated in an accommodation space 100a which is formed by the principal surface 10a of the first base material 10 and the concave portion 20b of the second base material 20, and the sensor element 30 is firmly fixed to the principal surface 10a of the first base material 10. In other words, when the first base material 10 and the second base material 20 are superimposed on (bonded to) each other, a space formed by the principal surface 10a of the first base material 10 and the concave portion 20b of the second base material 20 is assumed to be the accommodation space 100a. In other words, the accommodation space 100a is formed between the first base material 10 and the second base material, and the second base material 20 is bonded to the first base material 10. Meanwhile, the accommodation spaces are spaces formed in association with the bonding between the first base material 10 and the second base material 20 and will be described by being denoted by reference numerals for convenience of description. Alternatively, the accommodation spaces may be referred to as accommodation space portions. The same is true of embodiments to be described later.

As described above, the principal surface 10a of the first base material 10 and the principal surface 20a of the second base material 20 are bonded together in a frame-like bonding region 40 indicated by dot hatching shown in FIG. 1A, and thus the inside of the accommodation space 100a is maintained airtight. When the bonding region 40 has a rectangular shape shown in this embodiment, the bonding region is constituted by a first bonding region 41 and a second bonding region 42 which are disposed opposite to each other and a third bonding region 43 and a fourth bonding region 44 which are disposed opposite to each other. The bonding regions 41, 42, 43, and 44 contiguously constitute the frame-like bonding region 40.

The sensor element 30 accommodated in the sensor device 100 according to this embodiment is a sensor element such as, for example, an angular velocity sensor or an acceleration sensor which detects a physical quantity. In this embodiment, an angular velocity sensor element will be described as an example. Accordingly, the sensor element 30 will be referred to as an angular velocity sensor element 30 in the following description.

As shown in FIG. 1A, the angular velocity sensor element 30 can detect angular velocities around the X-, Y-, and Z-axes which are coordinate axes shown in the drawing. That is, the angular velocity sensor element 30 includes an X-axis sensing unit 30X that detects an angular velocity around the X-axis, a Y-axis sensing unit 30Y that detects an angular velocity around the Y-axis, and a Z-axis sensing unit 30Z that detects an angular velocity around the Z-axis.

As shown in FIG. 1B, in the angular velocity sensor element 30, the X-axis sensing unit 30X includes a movable unit 30x, the Y-axis sensing unit 30Y includes a movable unit 30y, and the Z-axis sensing unit 30Z includes a movable unit 30z. Concave portions 10b are formed on the principal surface 10a side of the first base material 10 so that the movable units 30x, 30y, and 30z are operable. Meanwhile, the concave portions 10b corresponding to the respective movable units 30x, 30y, and 30z may be formed so as to communicate with each other.

The first base material 10 is provided with a drawing wiring in order to electrically connect an external electronic component not shown in the drawing and the angular velocity sensor element 30. As shown in FIG. 1A, a plurality of wirings 51 constituting a first wiring portion are disposed in which a plurality of connection wirings 51a for the input of a signal for exciting and driving the X-axis sensing unit 30X and for the output of an angular velocity detection signal extend from the X-axis sensing unit 30X through the first bonding region 41 to the outside, that is, in a direction of an arrow d1 shown in the drawing (hereinafter, referred to as a first direction d1) which is the X (−) direction and are connected to a plurality of external connection terminals 51b, respectively. Similarly, a plurality of wirings 52 constituting the first wiring portion and a second wiring portion are disposed in which a plurality of connection wirings 52a for the input of a signal for exciting and driving the Y-axis sensing unit 30Y and for the output of an angular velocity detection signal extend to the outside, that is, in the first direction d1 through the first bonding region 41 and in a direction of an arrow d2 shown in the drawing (hereinafter, referred to as a second direction d2) which is the X (+) direction from the Y-axis sensing unit 30Y through the second bonding region 42 and are connected to a plurality of external connection terminals 52b, respectively. In addition, a plurality of wirings 53 constituting the second wiring portion are disposed in which a plurality of connection wirings 53a for the input of a signal for exciting and driving the Z-axis sensing unit 30Z and for the output of an angular velocity detection signal extend in the external second direction d2 from the Z-axis sensing unit 30Z through the second bonding region 42 and are connected to a plurality of external connection terminals 53b, respectively.

FIG. 2A is an enlarged cross-sectional view of a portion B-B' of the sensor device 100 shown in FIG. 1A, FIG. 2B is an enlarged cross-sectional view of a portion C-C' of the sensor device 100 shown in FIG. 1A, and FIG. 2C is an enlarged cross-sectional view of a portion D-D' of the sensor device 100 shown in FIG. 1A.

As shown FIG. 2B, grooves 10c having the connection wirings 52a and 53a disposed therein are formed on the principal surface 10a side of the first base material 10. An electric insulating material such as, for example, glass or silicon is used as the first base material 10. A raw base material of the angular velocity sensor element 30 is firmly fixed onto the principal surface 10a of the first base material 10, and the sensing units 30X, 30Y, and 30Z are formed using a MEMS technique. Accordingly, in a state where the wirings 51, 52, and 53 are formed on the principal surface 10a of the first base material 10, it is difficult to bond a raw base material of the angular velocity sensor element 30 onto the principal surface 10a of the first base material 10. For this reason, the grooves 10c are formed, and the wirings 51, 52, and 53 are formed on the respective bottom surfaces of the grooves 10c.

As described above, the first base material 10 is formed of an electric insulating base material such as glass, silicon which is not doped with impurities, or silicon on insulator (SOI), and the second base material 20 is formed of a silicon base material. The first base material 10 and the second base material 20 are bonded together by anodic bonding in the bonding region 40 and maintain airtightness. However, as shown in FIG. 1A, the plurality of connection wirings 51a extend in the first direction d1 from the X-axis sensing unit 30X through the first bonding region 41 and are connected to the plurality of external connection terminals 51b, respectively, and thus the plurality of wirings 51 are disposed. Similarly, the plurality of connection wirings 52a extend in the first direction d1 from the Y-axis sensing unit 30Y through the first bonding region 41 and extend in the second direction d2 from the Y-axis sensing unit through the second bonding region 42 and are connected to the plurality of external connection terminals 52b, respectively, and thus the plurality of wirings 52 are disposed. In addition, the connection wirings 53a extend in the second direction d2 through the second bonding region 42 from the Z-axis sensing unit 30Z and are connected to the plurality of external connection terminals 53b, respectively, and thus the plurality of wirings 53 are disposed.

As shown in FIGS. 2A and 2C, in intersection portions where the connection wirings 51a, 52a, and 53a extend to the outside of the accommodation space 100a so as to intersect the first bonding region 41 and the second bonding region 42, a gap is generated between the principal surface 20a of the second base material 20 and the grooves 10c. The gap is airtightly sealed with a sealing member 60. The sealing member 60 is formed of tetraethyl orthosilicate (Si(OC$_2$H$_5$)$_4$) (TEOS) by a plasma CVD method, and the principal surface 20a of the second base material 20 is bonded thereto, and thus it is possible to seal a gap between the groove 10c and the principal surface 20a of the second base material 20. Meanwhile, the sealing member 60 may be a metal oxide film having an electric insulating property, for example, SiO$_2$ or Al$_2$O$_3$.

As described above, the first base material 10 and the second base material 20 are anodically bonded together in the bonding region 40. The anodic bonding is used as a method of bonding the first base material 10 formed of a glass base material to the second base material 20 formed of a silicon base material, which are included in the sensor device 100 according to this embodiment, while maintaining airtightness. In the anodic bonding, when the base materials are heated while applying a voltage of approximately 400 to 500 V thereto, covalent bonding occurs due to ions in glass moving to a bonding interface, and thus the base materials are firmly bonded together. However, a material different from that of the first base material 10 or the second base material 20 is used for the sealing member 60 for filling and sealing the groove 10c of the first base material 10. Due to this, there is a concern of the bonding strength between the first base material 10 and the second base material 20 in a region where the sealing member 60 is disposed, that is, the groove 10c falling below a bonding strength of a region where the principal surface 10a of the first base material 10 and the principal surface 20a of the second base material 20 are directly bonded together in the bonding region 40.

For example, as shown in FIG. 3A which is a plan view in a state where a second base material 3 is omitted, in a sensor device 1 of the related art which is shown in FIGS. 3A and 3B, all of the wirings 5a connected to the X-axis sensing unit 30X of the angular velocity sensor element 30, wirings 5b connected to the Y-axis sensing unit 30Y, and wirings 5c connected to the Z-axis sensing unit 30Z extend to the outside toward the X (−) direction, that is, a direction of an arrow d shown in the drawing in a first bonding region 4a on one side in the bonding region 4 where the principal surface 2a of the first base material 2 and the principal surface 3a of the second base material 3 which are shown in FIG. 2B are bonded together so as to intersect the first bonding region 4a. Accordingly, as shown in FIG. 3B which is a cross-sectional view of a cross-section of a portion (cross-section of a portion E-E') of the first bonding region 4a shown in FIG. 3A, all grooves 2b disposed in the wirings 5a, 5b, and 5c formed in the first base material 2 are disposed so as to be superimposed on the first bonding region 4a, and a bonding region between a sealing member 6 sealing the groove 2b and the principal surface 3a of the second base material 3 occupies most of the first bonding region 4a.

That is, the above-mentioned anodic bonding region becomes narrower, and thus the bonding strength of the first bonding region 4a is decreased. When an external load stress is applied to the sensor device 1, the bonding between the sealing member 6 and the principal surface 3a of the second base material 3 is broken, and thus there is a concern of the internal environment of the sensor device 1 being deteriorated.

However, as described above, in the sensor device 100 according to this embodiment, the connection wirings 51a, 52a, and 53a mentioned above are divided into the first direction d1 and the second direction d2 through the first bonding region 41 and the second bonding region 42, respectively, and extend to the outside. Accordingly, the proportion of a bonding region between the principal surface 20a of the second base material 20 and the sealing members 60 filled in the grooves 10c of the first base material 10 in the first bonding region 41 and the second bonding region 42 is decreased. Thereby, a region where the principal surface 10a of the first base material 10 and the principal surface 20a of the second base material 20 which are anodically bonded together, that is, the area of the bonding region between the connection wirings can be increased, and thus it is possible to reduce the deterioration of bonding strength.

Further, as in the sensor device 100 according to this embodiment which is shown in FIG. 1A, substantially the same number of connection wirings 51a, 52a, and 53a is disposed in the first direction d1 and the second direction d2 through the first bonding region 41 and the second bonding region 42, respectively. Thereby, the bonding strength between the first bonding region 41 and the second bonding region 42 is balanced, and thus it is possible to distribute a well-balanced bonding strength of the bonding region 40.

In the sensor device 1 of the related art which is shown in FIG. 3A, the wirings 5c are drawn around over a long distance in the Z-axis sensing unit 30Z disposed farthest away from the first bonding region 4a. However, in the sensor device 100 according to this embodiment which is shown in FIG. 1A, the connection wirings 51a extend in the first direction d1 from the X-axis sensing unit 30X so as to intersect the first bonding region 41 located closest thereto, and the connection wirings 53a extend in the second direction d2 from the Z-axis sensing unit 30Z so as to intersect the second bonding region 42 which is closest thereto. Accordingly, the connection wirings 51a, 52a, and 53a extending from the sensing units 30X, 30Y, and 30Z can be disposed so as to be drawn around over a short distance, and thus it is possible to control wiring resistance values generated in the connection wirings 51a, 52a, and 53a, to suppress parasitic capacitance to a low level, and to maintain the sensitivity of the sensor device 100 without decreasing the sensitivity.

In addition, as shown in FIGS. 1A and 1B, the first bonding region 41 and the second bonding region 42 are disposed opposite to each other through the accommodation space 100a, and the wirings 51, 52, and 53 are disposed so that the first direction d1 and the second direction d2 face opposite directions, and thus the bonding region 40 having a well-balanced bonding strength is disposed. Accordingly, a balance of the bonding strength of the entire bonding region 40 is suitably maintained, and thus it is possible to maintain a stable and high degree of airtightness in the accommodation space 100a.

Figure 4A:
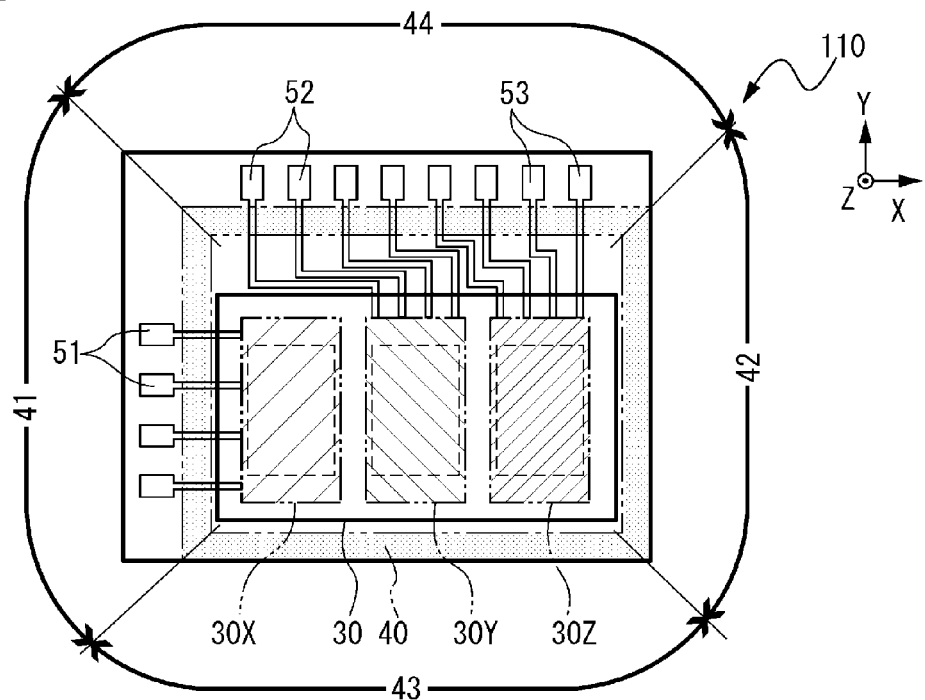
FIGS. 4A and 4B are plan views showing other configurations of the electronic device according to the first embodiment.
Figure 4B:
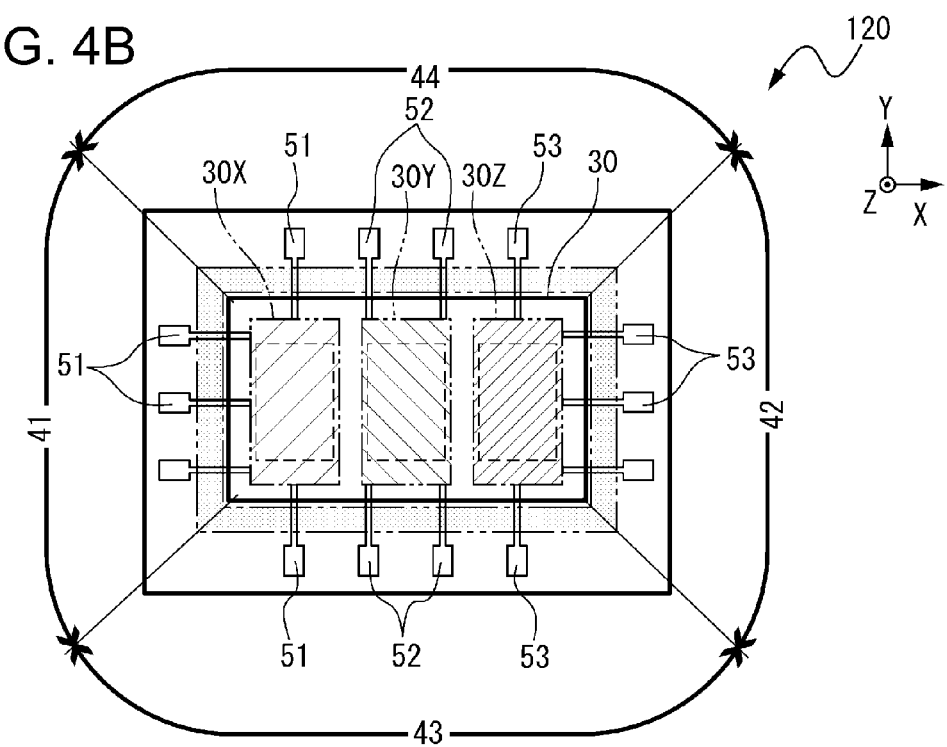

Other modes of the sensor device 100 according to the first embodiment are shown in FIGS. 4A and 4B. In the sensor device 110 shown in FIG. 4A, the plurality of wirings 51 extending from the X-axis sensing unit 30X extend to the outside so as to intersect the first bonding region 41, and the plurality of wirings 52 extending from the Y-axis sensing unit 30Y and the plurality of wirings 53 extending from the Z-axis sensing unit 30Z extend to the outside so as to intersect the fourth bonding region 44. As in the sensor device 110, the wirings 51, 52, and 53 may extend to the outside so as to intersect the bonding region adjacent thereto. Meanwhile, the first bonding region 41 and the fourth bonding region 44 are shown in this example. However, for example, wirings may be disposed in the first bonding region 41 and the third bonding region 43, wirings may be disposed in the second bonding region 42 and the third bonding region 43, and wirings may be disposed in the second bonding region 42 and the fourth bonding region 44. That is, the wirings 51, 52, and 53 may be disposed in different bonding regions.

According to the extension mode of the wirings 51, 52, and 53 shown in the sensor device 110, the wirings 51, 52, and 53 may extend to the outside so as to be divided into the first bonding region 41 and the fourth bonding region 44, similar to the sensor device 100. Accordingly, the proportion of a bonding region between the principal surface 20a of the second base material 20 and the sealing member 60 filled in the groove 10c of the first base material 10 in the first bonding region 41 and the fourth bonding region 44 is decreased, and thus it is possible to obtain a wide region where the principal surface 10a of the first base material 10 and the principal surface 20a of the second base material 20, which are anodically bonded together, are directly bonded together, that is, high bonding strength.

In a sensor device 120 shown in FIG. 4B, the wirings 51, 52, and 53 extend so as to intersect four bonding regions 41, 42, 43, and 44. According to the extension mode of the wirings 51, 52, and 53, the wirings 51, 52, and 53 extend to the outside so as to be divided into the bonding regions 41, 42, 43, and 44, that is, over the entire bonding region 40, similar to the sensor device 100. Accordingly, the bonding region between the principal surface 20a of the second base material 20 and the sealing members 60 filled in the grooves 10c of the first base material 10 in the bonding region 40 is uniformly distributed, and a region where the principal surface 10a of the first base material 10 and the principal surface 20a of the second base material 20, which are anodically bonded together, are directly bonded together is also uniformly disposed. Thereby, a well-balanced arrangement of a bonding surface is configured, and thus it is possible to obtain a stable and high degree of bonding strength.

Second Embodiment

Figure 5:
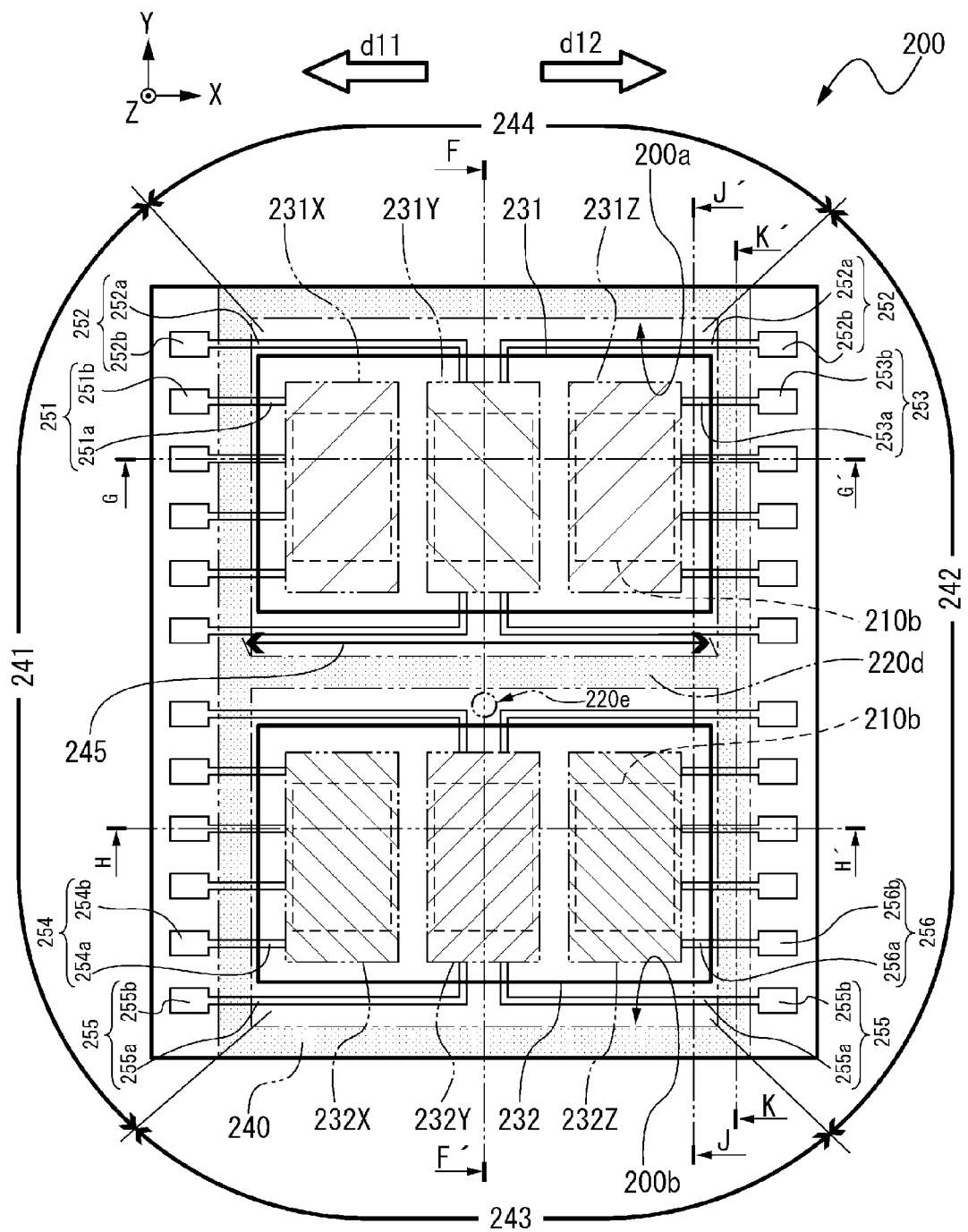
FIG. 5 is a plan view showing an electronic device according to a second embodiment in which a second base material is omitted.
Figure 6A:
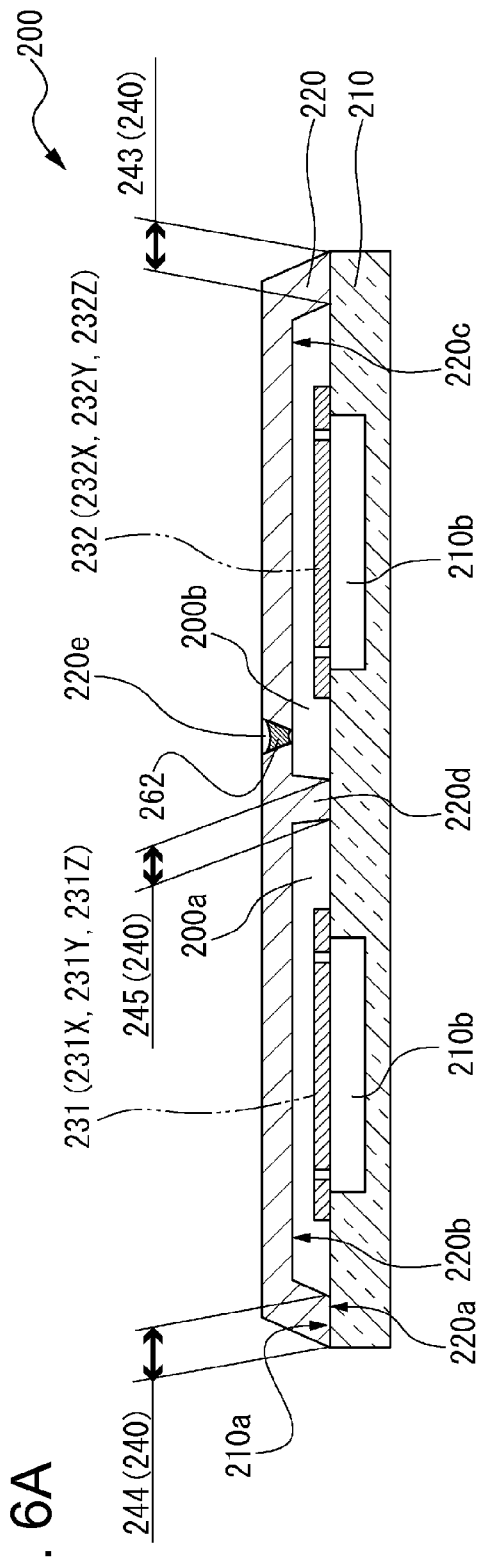
FIGS. 6A and 6B show the electronic device according to the second embodiment.

FIG. 5 is a plan view showing an electronic device according to a second embodiment in a state where a second base material is omitted. As shown in FIG. 6A which is a cross-sectional view of a portion F-F' shown in FIG. 5, in a sensor device 200 as an electronic device shown in FIG. 5, a second base material 220 is provided with a first concave portion 220b and a second concave portion 220c which are formed on a principal surface 220a side, and a partition wall 220d is formed between the first concave portion 220b and the second concave portion 220c. A first accommodation space 200a is formed by the first concave portion 220b and the principal surface 210a of the first base material 210, and a second accommodation space 200b is formed by the second concave portion 220c and the principal surface 210a of the first base material 210. In other words, the accommodation space is partitioned (divided) into the first accommodation space 200a and the second accommodation space 200b by the partition wall 220d.

As shown in FIG. 6A, an angular velocity sensor element 231 as a functional element is accommodated in the first accommodation space 200a of the sensor device 200 so as to be bonded to the principal surface 210a of the first base material 210. In addition, an acceleration sensor element 232 as a functional element is accommodated in the second accommodation space 200b so as to be bonded to the principal surface 210a of the first base material 210. The angular velocity sensor element 231 includes an X-axis sensing unit 231X that detects an angular velocity around an X-axis, a Y-axis sensing unit 231Y that detects an angular velocity around a Y-axis, and a Z-axis sensing unit 231Z that detects an angular velocity around a Z-axis so as to be capable of detecting the angular velocities around the X-, Y-, and Z-axes shown in the drawing. In addition, the acceleration sensor element 232 includes an X-direction sensing unit 232X that detects acceleration in the X-axis direction, a Y-direction sensing unit 232Y that detects acceleration in the Y-axis direction, and a Z-direction sensing unit 232Z that detects acceleration in the Z-axis direction so as to be capable of detecting the acceleration in the X-, Y-, and Z-axis directions shown in the drawing.

In the first accommodation space 200a accommodating the angular velocity sensor element 231, driving units not shown in the drawing of the respective sensing units 231X, 231Y, and 231Z of the angular velocity sensor element 231 vibrate and are driven at a predetermined frequency and detect angular velocity from a Coriolis force generated due to rotation added around the sensing axes. Accordingly, the first accommodation space 200a is maintained in a decompression environment, that is, a vacuum state so that the vibration driving in the driving units can be stably maintained. On the other hand, the acceleration sensor element 232 accommodated in the second accommodation space 200b detects the movement of a movable unit, not shown in the drawing and formed to be capable of being driven in acceleration detection directions, which is delayed due to inertia even when acceleration is added to each of the detection directions, and generates an acceleration signal. Accordingly, the second accommodation space 200b is maintained in an atmospheric pressure environment filled with gas components as movable resistance, for example, air (nitrogen, oxygen, and the like) or an inert gas or a pressurized environment so that the vibration of the movable unit is rapidly attenuated when the movable unit is moved to be delayed due to inertia and the addition of acceleration disappears.

As described above, the first accommodation space 200a and the second accommodation space 200b are maintained in different internal environments. Consequently, as shown in FIG. 5, the second accommodation space 200b accommodating the acceleration sensor element 232 includes a sealing hole 220e for airtightly sealing the second accommodation space 200b. As shown in FIG. 6A, the sealing hole 220e is formed at least one location of the second base material 220 so as to communicate with the second accommodation space 200b, that is, so as to pass through the second concave portion 220c.

Although will be described later, after the first base material 210 and the second base material 220 are bonded together in a decompression environment, the sensor device 200 is set to be in an atmospheric pressure environment, and gas components are introduced into the second accommodation space 200b from the sealing hole 220e. Thereafter, the sealing hole 220e is sealed with a second sealing member 262, and the second accommodation space 200b is airtightly sealed. In this embodiment, the second sealing member 262 airtightly seals the sealing hole 220e by irradiating a solder ball with a laser to melt the solder ball. A metal such as Au, Ge, Zn, Sn, or Sb or an alloy thereof is used as a material of the solder ball, and an alloy of Au and Ge is preferably used.

Although not shown in the drawing, a metallization film is formed on the surface of a sealing hole 220e in order to obtain adhesiveness to the second sealing member 262, and a high adhesiveness to the metallization film by melting the second sealing member 262 of an AuGe solder ball under inert gas atmosphere, and thus it is possible to obtain a high degree of airtightness in the sealing hole 220e.

As shown in FIG. 6A, the sensor device 200 according to this embodiment includes a frame-like bonding region 240, indicated by dot hatching shown in FIG. 5, in which the principal surface 210a of the first base material 210 and the principal surface 220a of the second base material 220 are anodically bonded together. The bonding region 240 is provided with a first bonding region 241, a second bonding region 242, a third bonding region 243, a fourth bonding region 244, and a partition wall bonding region 245. The first bonding region and the second bonding region are disposed opposite to each other. The third bonding region and the fourth bonding region are disposed so as to intersect the bonding regions 241 and 242. A partition wall 220d of the second base material 220 is bonded to the partition wall bonding region. The bonding regions 241, 242, 243, and 244 contiguously constitute a frame-like bonding region. In addition, the bonding region is further divided (partitioned) into the first accommodation space 200a and the second accommodation space 200b by the partition wall bonding region 245 extending to the second bonding region 242 from the first bonding region 241.

A drawing wiring is disposed in the first base material 210 in order to electrically connect an external electronic component not shown in the drawing, the angular velocity sensor element 231, and the acceleration sensor element 232. As shown in FIG. 5, in the angular velocity sensor element 231, a plurality of wirings 251 having a plurality of connection wirings 251a for the input of a signal for exciting and driving an X-axis sensing unit 231X and for the output of an angular velocity detection signal which extend from the X-axis sensing unit 231X through the first bonding region 241 to the outside, that is, in a direction of an arrow d11 shown in the drawing (hereinafter, referred to as a first direction d11) which is the X (−) direction and a plurality of external connection terminals 251b that are connected to the connection wirings are disposed. Similarly, a plurality of wirings 252 having a plurality of connection wirings 252a for the input of a signal for exciting and driving a Y-axis sensing unit 231Y and for the output of an angular velocity detection signal which extend from the Y-axis sensing unit 231Y in the first direction d11 through the first bonding region 241 and to the outside, that is, in a direction of an arrow d12 shown in the drawing (hereinafter, referred to as a second direction d12) which is the X (+) direction through the second bonding region 242 and a plurality of external connection terminals 252b that are connected to the connection wirings are disposed. In addition, a plurality of wirings 253 having a plurality of connection wirings 253a for the input of a signal for exciting and driving a Z-axis sensing unit 231Z and for the output of an angular velocity detection signal which extend from the Z-axis sensing unit 231Z in the external second direction d12 through the second bonding region 242 and a plurality of external connection terminals 253b that are connected to the connection wirings are disposed.

In the acceleration sensor element 232, a plurality of wirings 254 having a plurality of connection wirings 254a for outputting an acceleration detection signal in the X direction which extend from an X-direction sensing unit 232X in the external first direction d11 through the first bonding region 241 and a plurality of external connection terminals 254b that are connected to the connection wirings are disposed. Similarly, a plurality of wirings 255 having a plurality of connection wirings 255a for outputting an acceleration detection signal in the Y direction which extend from a Y-direction sensing unit 232Y in the external first direction d11 through the first bonding region 241 and in the external second direction d12 through the second bonding region 242 and a plurality of external connection terminals 255b that are connected to the connection wirings are disposed. In addition, a plurality of wirings 256 having a plurality of connection wirings 256a for outputting an acceleration detection signal in a Z direction which extend from a Z-direction sensing unit 232Z in the external second direction d12 through the second bonding region 242 and a plurality of external connection terminals 256b that are connected to the connection wirings are disposed.

Figure 6B:
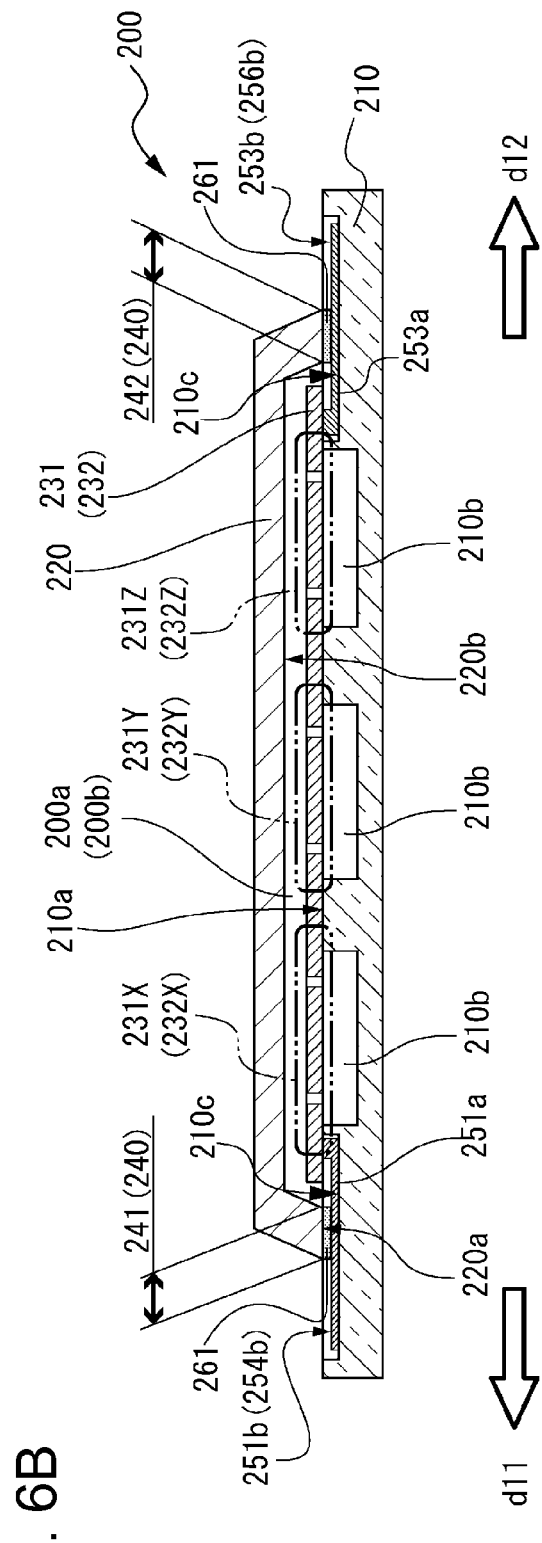

FIG. 6B is a cross-sectional view of a portion G-G' and a portion H-H' shown in FIG. 5. Meanwhile, a cross-sectional configuration of the portion H-H' is the same as a cross-sectional configuration of the portion G-G', and thus a cross-sectional portion of the portion G-G' will be described as an example.

As shown in FIG. 6B, the principal surface 210a of the first base material 210 and the principal surface 220a of the second base material 220 are connected to each other in the bonding region 240, and the first accommodation space 200a is formed by the first concave portion 220b of the second base material 220. In addition, concave portions 210b corresponding to respective driving units (movable units) included in the sensing units 231X, 231Y, and 231Z of the sensor element 231 are formed on the principal surface 220a side of the second base material 220.

FIG. 7A is a cross-sectional view of a portion J-J' shown in FIG. 5. As shown in FIG. 7A, the wirings 251, 252, 253, 254, 255, and 256 for electrically connecting the sensor elements 231 and 232 described in FIG. 5 and an external electronic component not shown in the drawing are drawn around in the first base material 210. Although described in the sensor device 100 according to the first embodiment, grooves 210c having the connection wirings 252a, 253a, 255a, and 256a disposed therein are formed on the principal surface 210a side of the first base material 210. An electric insulating material such as, for example, glass or silicon is used as the first base material 210. Raw material substrates of the angular velocity sensor element 231 and the acceleration sensor element 232 are firmly fixed onto the principal surface 210a of the first base material 210, and the sensing units 231X, 231Y, 231Z, 232X, 232Y, and 232Z are formed using a MEMS technique. Accordingly, in a state where the wirings 251, 252, 253, 254, 255, and 256 are formed on the principal surface 210a of the first base material 210, it is difficult to bond the raw material substrates of the angular velocity sensor element 231 and the acceleration sensor element 232 onto the principal surface 210a of the first base material 210. For this reason, the grooves 210c are formed, and the wirings 251, 252, 253, 254, 255, and 256 are formed on the respective bottom surfaces of the grooves 210c.

As described above, the first base material 210 is formed of an electric insulating base material such as, for example, glass or silicon, and the second base material 220 is formed of a silicon base material. The first base material 210 and the second base material 220 are bonded together by anodic bonding in the bonding region 240 and maintain airtightness. However, as shown in FIG. 5, in the case of the angular velocity sensor element 231, the plurality of connection wirings 251a extend in the external first direction d11 through the first bonding region 241 from the X-axis sensing unit 231X and are connected to the plurality of external connection terminals 251b, and thus the plurality of wirings 251 are disposed. Similarly, the plurality of connection wirings 252a extend in the external first direction d11 through the first bonding region 241 and in the external second direction d12 through the second bonding region 242 from the Y-axis sensing unit 231Y and are connected to the plurality of external connection terminals 252b, and thus the plurality of wirings 252 are disposed. In addition, the connection wirings 253a extend in the external second direction d12 through the second bonding region 242 from the Z-axis sensing unit 231Z and are connected to the plurality of external connection terminals 253b, and thus the plurality of wirings 253 are disposed.

Similarly, also in the case of the acceleration sensor element 232, the plurality of connection wirings 254a extend in the external first direction d11 through the first bonding region 241 from the X-direction sensing unit 232X and are connected to the plurality of external connection terminals 254b, and thus the plurality of wirings 254 are disposed. Similarly, the plurality of connection wirings 255a extend in the external first direction d11 through the first bonding region 241 and in the external second direction d12 through the second bonding region 242 from the Y-direction sensing unit 232Y and are connected to the plurality of external connection terminals 255b, and thus the plurality of wirings 255 are disposed. In addition, the connection wirings 256a extend in the external second direction d12 through the second bonding region 242 from the Z-direction sensing unit 232Z and are connected to the plurality of external connection terminals 256b, and thus the plurality of wirings 256 are disposed.

As shown in FIG. 6B and FIG. 7B which is a cross-sectional view of a portion K-K' shown in FIG. 5, in an intersection portion where the connection wirings 251a, 252a, 253a, 254a, 255a, and 256a extend to the outside of the accommodation spaces 200a and 200b so as to intersect the first bonding region 241 and the second bonding region 242, gaps are generated between the principal surface 220a of the second base material 220 and the grooves 210c. In a state where the gaps are present, the sensor device 200 is airtightly sealed with the first sealing member 261 under a decompression environment, and thus the first accommodation space 200a is maintained in a decompression environment. On the other hand, as described above, since the second base material 220 includes the sealing hole 220e before the airtight sealing, the second accommodation space 200b returns to an atmospheric pressure environment after the airtight sealing using the first sealing member 261. In addition, the sealing hole 220e mentioned above is airtightly sealed with the second sealing member 262 under an atmospheric pressure environment, and the second accommodation space 200b is maintained airtight.

The first sealing member 261 is formed of tetraethyl orthosilicate $(Si(OC_2H_5)_4)$ (TEOS) by a plasma CVD method, and the principal surface 220a of the second base material 220 is bonded thereto, and thus it is possible to seal a gap between the groove 210c and the principal surface 220a of the second base material 220. Meanwhile, the first sealing member 261 may be a metal oxide film having an electric insulating property, for example, $SiO_2$ or $Al_2O_3$.

Similarly to the sensor device 100 according to the first embodiment, also in the sensor device 200 according to this embodiment, there is a concern that the bonding strength between the first base material 210 and the second base material 220 in a region where the first sealing member 261 is disposed, that is, the groove 210c may fall below a bonding strength of a region where the principal surface 210a of the first base material 210 and the principal surface 220a of the second base material 220 are directly bonded together in the bonding region 240. Further, in the sensor device 200 according to this embodiment, a composite sensor device constituted by the angular velocity sensor element 231 and the acceleration sensor element 232 is configured as a functional element, and the number of wirings 251, 252, 253, 254, 255, and 256 which are connected to the respective sensor elements 231 and 232 and extend to the outside so as to intersect the bonding region 240 is increased, and thus a bonding region between the first sealing member 261, the first base material 210, and the second base material 220 is also increased.

Consequently, as in the sensor device 200 shown in FIG. 5, substantially the same number of connection wirings 251a, 252a, 253a, 254a, 255a, and 256a is disposed in the first bonding region 241 and the second bonding region 242. Thereby, the bonding strength between the first bonding region 241 and the second bonding region 242 is balanced, and thus it is possible to distribute a well-balanced bonding strength of the bonding region 240.

In addition, as shown in FIG. 5, the first bonding region 241 and the second bonding region 242 are disposed opposite to each other through the first accommodation space 200a and the second accommodation space 200b, and the wirings 251, 252, 253, 254, 255, and 256 are disposed toward the first direction d11 and the second direction d12 which are mutually opposite directions, and thus the bonding region 240 is disposed so as to a balanced bonding strength. Accordingly, a balance of the bonding strength of the entire bonding region 240 is suitably maintained, and thus it is possible to maintain a stable and high degree of airtightness in the accommodation spaces 200a and 200b.

Meanwhile, in this embodiment, a description has been given of a configuration in which the sensor device 200 includes two types of functional elements of the angular velocity sensor element 231 and the acceleration sensor element 232, but the invention is not limited thereto. For example, the sensor device may include three or more types of functional elements or may include a plurality of the same functional elements. Further, the wirings 251, 252, 253, 254, 255, and 256 extend to the outside of the first accommodation space 200a and the second accommodation space 200b so as to intersect the first bonding region 241 and the second bonding region 242, but the invention is not limited thereto. The wirings 251, 252, 253, 254, 255, and 256 may be substantially uniformly disposed in at least two bonding regions.

Third Embodiment

Figure 8A:
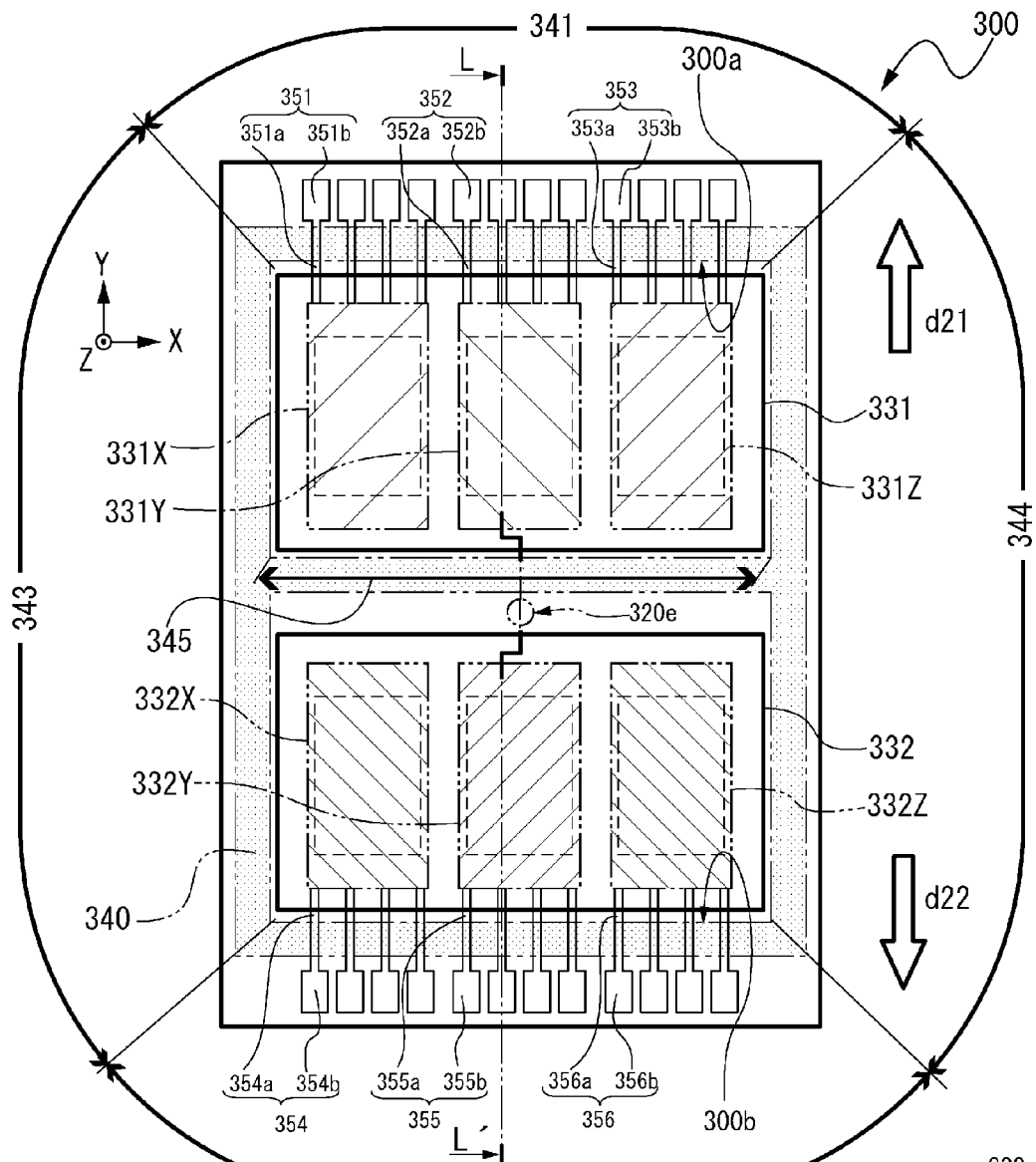
FIGS. 8A and 8B show an electronic device according to a third embodiment.
Figure 8B:
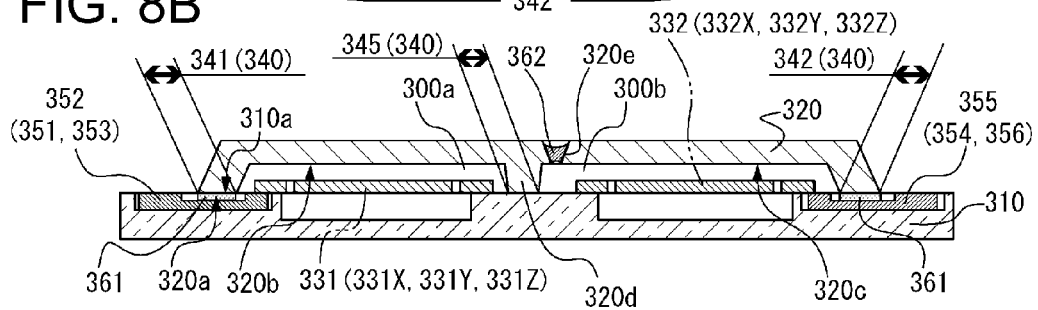

FIGS. 8A and 8B show an electronic device according to a third embodiment. FIG. 8A is a plan view in which a second base material is omitted, and FIG. 8B is a cross-sectional view of a portion L-L' shown in FIG. 8A. A sensor device 300 as an electronic device shown in FIGS. 8A and 8B is different from the sensor device 200 according to the second embodiment in that the arrangement direction of the wirings 251, 252, 253, 254 and 256 in the sensor device according to the second embodiment, that is, the first bonding region 241 and the second bonding region 242 are disposed opposite to each other through a partition wall. Accordingly, the same components as those of the sensor device 200 will be denoted by the same reference numerals and signs, and a detailed description thereof will be omitted.

As shown in FIG. 8B, in the sensor device 300, a first concave portion 320b and a second concave portion 320c on a principal surface 320a side of a second base material 320, and a partition wall 320d is formed between the first concave portion 320b and the second concave portion 320c. A first accommodation space 300a is formed by the first concave portion 320b and a principal surface 310a of the first base material 310, and a second accommodation space 300b is formed by the second concave portion 320c and the principal surface 310a of the first base material 310.

As shown in FIG. 8A, an angular velocity sensor element 331 as a functional element which is bonded to the principal surface 310a of the first base material 310 is accommodated in the first accommodation space 300a of the sensor device 300. In addition, an acceleration sensor element 332 as a functional element which is bonded to the principal surface 310a of the first base material 310 is accommodated in the second accommodation space 300b. The angular velocity sensor element 331 includes an X-axis sensing unit 331X that detects an angular velocity around the X-axis, a Y-axis sensing unit 331Y that detects an angular velocity around the Y-axis, and a Z-axis sensing unit 331Z that detects an angular velocity around the Z-axis so as to be capable of detecting the angular velocities around the X-, Y-, and Z-axes shown in the drawing. In addition, the acceleration sensor element 332 includes an X-direction sensing unit 332X that detects acceleration in the X-axis direction, a Y-direction sensing unit 332Y that detects acceleration in the Y-axis direction, and a Z-direction sensing unit 332Z that detects acceleration in the Z-axis direction so as to be capable of detecting the acceleration in the X-, Y-, and Z-axis directions shown in the drawing.

A sealing hole 320e is formed in the second concave portion 320c of the second base material 320 corresponding to the second accommodation space 300b, and the second accommodation space 300b is airtightly sealed with a second sealing member 362. That is, after the first base material 310 and the second base material 320 are bonded together in a decompression environment, the sensor device 300 is set to be in an atmospheric pressure environment, and gas components are introduced into the second accommodation space 300b from the sealing hole 320e. Thereafter, the sealing hole 320e is sealed with the second sealing member 362, and thus the second accommodation space 300b is airtightly sealed. In this embodiment, the second sealing member 362 airtightly seals the sealing hole 320e by irradiating a solder ball with a laser and melting the solder ball. A metal such as, Au, Ge, Zn, Sn, or Sb or an alloy thereof is used as a material of the solder ball, and an alloy of Au and Ge is preferably used.

As shown in FIG. 8A, the sensor device 300 according to this embodiment includes a frame-like bonding region 340, indicated by dot hatching shown in FIG. 8A, in which the principal surface 310a of the first base material 310 and the principal surface 320a of the second base material 320 are anodically bonded together. The bonding region 340 is provided with a first bonding region 341, a second bonding region 342, a third bonding region 343, a fourth bonding region 344, and a partition wall bonding region 345. The first bonding region and the second bonding region are disposed opposite to each other through the partition wall 320d. The third bonding region and the fourth bonding region are disposed so as to intersect the bonding regions 341 and 342. The partition wall 320d of the second base material 320 is bonded to the partition wall bonding region 345. The bonding regions 341, 342, 343, and 344 contiguously constitute a frame-like bonding region. Further, division into the first accommodation space 300a and the second accommodation space 300b is further performed by the partition wall bonding region 345 is performed by the partition wall bonding region 345 extending to the fourth bonding region 344 from the third bonding region 343.

A drawing wiring is disposed in the first base material 310 in order to electrically connect an external electronic component not shown in the drawing, the angular velocity sensor element 331, and the acceleration sensor element 332. As shown in FIG. 8A, in the angular velocity sensor element 331, a plurality of wirings 351 having a plurality of connection wirings 351a that extend from the X-axis sensing unit 331X through the first bonding region 341 to the outside, that is, in a direction of an arrow d21 shown in the drawing (hereinafter, referred to as a first direction d21) which is the Y (+) direction and a plurality of external connection terminals 351b that are connected to the connection wirings are disposed. In addition, a plurality of wirings 352 having a plurality of connection wirings 352a extending from the Y-axis sensing unit 331Y and a plurality of external connection terminals 352b that are connected to the connection wirings are disposed, and a plurality of wirings 353 having a plurality of connection wirings 353a extending from the Z-axis sensing unit 331Z and a plurality of external connection terminals 353b that are connected to the connection wirings are disposed.

In the acceleration sensor element 332, a plurality of wirings 354 having a plurality of connection wirings 354a extending from the X-direction sensing unit 332X through the second bonding region 342 to the outside, that is, in a direction of an arrow d22 shown in the drawing (hereinafter, referred to as a second direction d22) which is the Y (−) direction and a plurality of external connection terminals 354b that are connected to the connection wirings are disposed. A plurality of wirings 355 having a plurality of connection wirings 355a extending from the Y-direction sensing unit 332Y and a plurality of external connection terminals 355b that are connected to the connection wirings are disposed, and a plurality of wirings 356 having a plurality of connection wirings 356a extending from the Z-direction sensing unit 332Z and a plurality of external connection terminals 356b that are connected to the connection wirings are disposed.

As shown in FIG. 8B which is a cross-sectional view of the portion L-L' shown in FIG. 8A, in intersection portions where the connection wirings 351a, 352a, and 353a disposed so as to intersect the first bonding region 341 and the connection wirings 354a, 355a, and 356a disposed so as to intersect the second bonding region 242 extend to the outside of the accommodation spaces 300a and 300b, gaps are generated between the principal surface 320a of the second base material 320 and grooves 310c of the first base material 310 for disposing the wirings 351, 352, 353, 354, 355, and 356. In a state where the gaps are present, the sensor device 300 is airtightly sealed with the first sealing member 361 under a decompression environment, and thus the first accommodation space 300a is maintained in a decompression environment. On the other hand, as described above, since the second base material 320 includes the sealing hole 320e before the airtight sealing, the second accommodation space 300b returns to an atmospheric pressure environment after the airtight sealing using the first sealing member 361. In addition, the sealing hole 320e mentioned above is airtightly sealed with the second sealing member 362 under an atmospheric pressure environment, and the second accommodation space 300b is maintained airtight.

The first sealing member 361 is formed of, for example, tetraethyl orthosilicate ($Si(OC_2H_5)_4$) (TEOS) by a plasma CVD method, and the principal surface 220a of the second base material 220 is bonded thereto, and thus it is possible to seal a gap between the groove 310c and the principal surface 320a of the second base material 320. Meanwhile, the first sealing member 361 may be a metal oxide film having an electric insulating property, for example, $SiO_2$ or $Al_2O_3$.

As described above, as in the sensor device 300 according to this embodiment, the first bonding region 341 is provided with the wirings 351, 352, and 353 which are disposed in the first accommodation space 300a and are connected to the angular velocity sensor element 331, and the second bonding region 342 facing the first bonding region 341 through the partition wall 320d is provided with the wirings 354, 355, and 356 which are disposed in the second accommodation space 300b and are connected to the acceleration sensor element 332. Accordingly, substantially the same number of wirings is disposed in the first bonding region 341 and the second bonding region 342, and a bonding strength between the first bonding region 341 and the second bonding region 342 is balanced, and thus it is possible to distribute a well-balanced bonding strength of the bonding region 340.

Fourth Embodiment

Figure 9A:
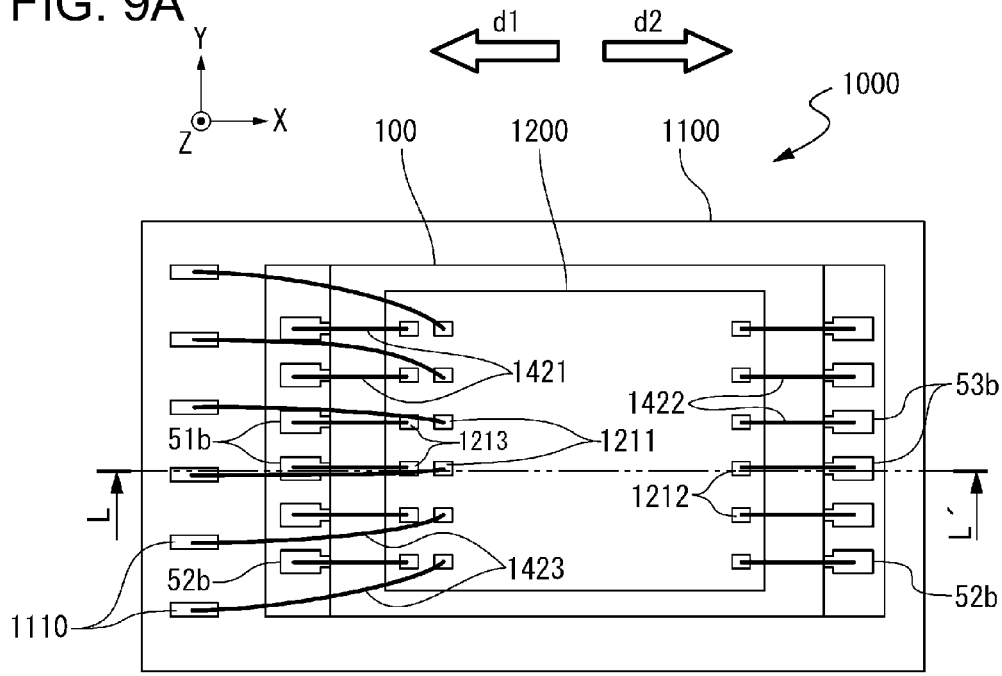
FIGS. 9A and 9B show an electronic device according to a fourth embodiment.
Figure 9B:
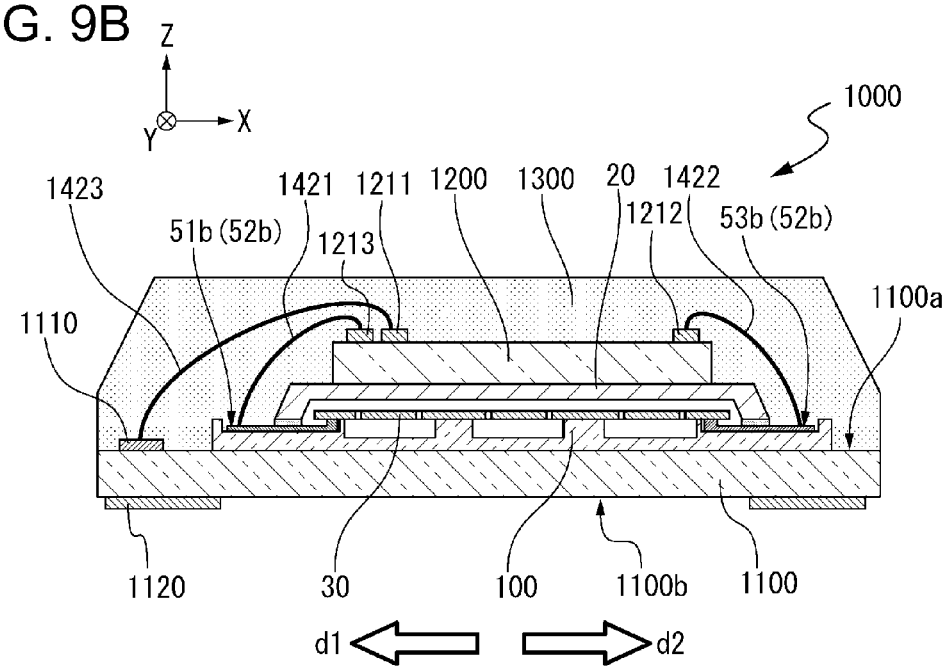

FIGS. 9A and 9B show an electronic device according to a fourth embodiment. FIG. 9A is a plan view in which a mold member is omitted, and FIG. 9B is a cross-sectional view of a portion L-L' shown in FIG. 9A. An electronic device 1000 (hereinafter, referred to as an electronic module 1000) shown in FIGS. 9A and 9B includes the sensor device 100, according to the first embodiment, which is bonded to a base substrate 1100 and includes an angular velocity sensor element 30 that detects angular velocities around three axes.

Further, a semiconductor element 1200 is bonded onto the second base material 20 of the sensor device 100 using a bonding member such as, for example, an epoxy-based adhesive. The semiconductor element 1200 includes at least a driving circuit unit, not shown in the drawing, which drives the angular velocity sensor element 30 included in the sensor device 100 and an angular velocity computation circuit unit, not shown in the drawing, which computes an angular velocity based on a detected signal from the angular velocity sensor element 30. A mold member 1300 is formed so as to cover the semiconductor element 1200 and the sensor device 100 included in the base substrate 1100.

As shown in FIG. 9A, the base substrate 1100 is a plate-like substrate having a rectangular plane and is preferably an electric insulating substrate, for example, a ceramic substrate, an epoxy resin substrate, or the like. In the electronic module 1000 according to this embodiment, a ceramic base substrate 1100 will be described as an example. The sensor device 100 is bonded onto a surface 1100a (hereinafter, referred to as a mounting surface 1100a) of the base substrate 1100 having the sensor device 100 mounted thereon and bonded thereto, using an epoxy-based resin adhesive or the like. In addition, a plurality of substrate connection terminals 1110 are formed on the mounting surface 1100a, and an external connection terminal 1120 for connection with an electrode included in an external substrate not shown in the drawing is formed on an outer surface 1100b serving as a surface opposite to the mounting surface 1100a. Meanwhile, the substrate connection terminal 1110 and the external connection terminal 1120 are electrically connected to each other through a wiring not shown in the drawing which is formed within the base substrate 1100.

The semiconductor element 1200 includes a plurality of connection pads 1211 and 1212 which are electrically connected to the connection terminals 51b, 52b, and 53b included in the sensor device 100 through bonding wires 1421 and 1422. Also as shown in FIG. 1A, in the sensor device 100 included in the electronic module 1000, the connection terminals 51b and the connection terminals 52b extending from the first bonding region 41 are disposed lined up in the Y direction on the X (−) side of the sensor device 100, that is, on the first direction d1 side in an arrow direction shown in the drawing as shown in FIG. 9A, and the connection terminals 53b and the connection terminals 52b extending from the second bonding region 42 are disposed lined up in the Y direction on the X (+) side of the sensor device 100, that is, on the second direction d2 side in an arrow direction shown in the drawing. The connection pads 1211 of the semiconductor element 1200 are disposed in the vicinity of an end on the first direction d1 side so as to be lined up in the Y direction, and the connection terminals 51b and 52b disposed on the first direction d1 side of the sensor device 100 are electrically connected to each other through the bonding wires 1421. The connection pads 1212 of the semiconductor element 1200 are disposed in the vicinity of an end on the second direction d2 side so as to be lined up in the Y direction, and the connection terminals 53b and 52b disposed on the second direction d2 side of the sensor device 100 are electrically connected to each other through the bonding wires 1422.

In this embodiment, the above-mentioned plurality of substrate connection terminals 1110 formed on the mounting surface 1100a of the base substrate 1100 are disposed outside the first direction d1 of the sensor device 100 so as to be lined up in the Y direction. In the semiconductor element 1200, connection pads 1213 electrically connected to the substrate connection terminal 1110 through bonding wires 1423 are disposed in the vicinity of an end in the first direction d1 so as to be lined up in the Y direction.

According to the electronic module 1000 according to this embodiment, since the lengths of the bonding wires 1421 and 1422 for electrically connecting the sensor device 100 and the semiconductor element 1200 can be reduced, it is possible to suppress wiring resistance and parasitic capacitance. Accordingly, it is possible to obtain the electronic module 1000 which is stable and has high accuracy. Meanwhile, an example in which the electronic module 1000 according to this embodiment includes the sensor device 100 has been described, but the invention is not limited thereto. The electronic module but may include the sensor device 110, the sensor device 120, the sensor device 200 according to the second embodiment, or the sensor device 300 according to the third embodiment.

Fifth Embodiment

As an electronic apparatus according to a fifth embodiment, a smartphone and a digital still camera including the sensor devices 100, 110, and 120 according to the first embodiment, the sensor device 200 according to the second embodiment, the sensor device 300 according to the third embodiment, or the electronic module 1000 according to the fourth embodiment will be described.

Figure 10:
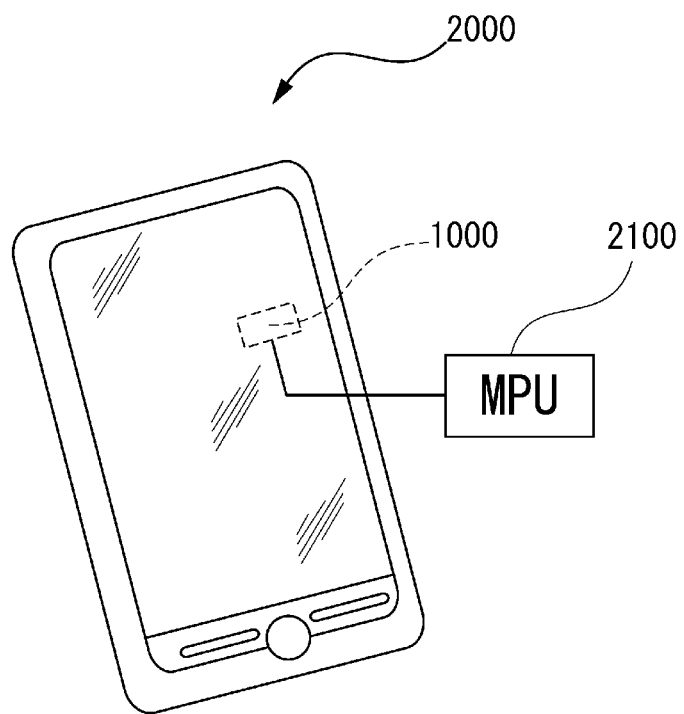
FIG. 10 is a diagram showing the exterior of a smartphone as an electronic apparatus according to a fifth embodiment.

FIG. 10 is a diagram showing the exterior of a smartphone 2000. The electronic module 1000 according to the third embodiment which detects the posture of the smartphone 2000 is embedded in the smartphone 2000. So-called motion sensing is performed by the electronic module 1000 being embedded, and thus it is possible to detect the posture of the smartphone 2000. A detected signal of the electronic module 1000 is supplied to, for example, a microcomputer chip 2100 (hereinafter, referred to as a MPU 2100), and the MPU 2100 can perform various processes in accordance with the motion sensing. In addition, the motion sensing can be used by embedding the electronic module 1000 in an electronic apparatus such as a mobile phone, a portable game machine, a game controller, a car navigation system, a pointing system, a head mounting display, or a tablet PC.

Figure 11:
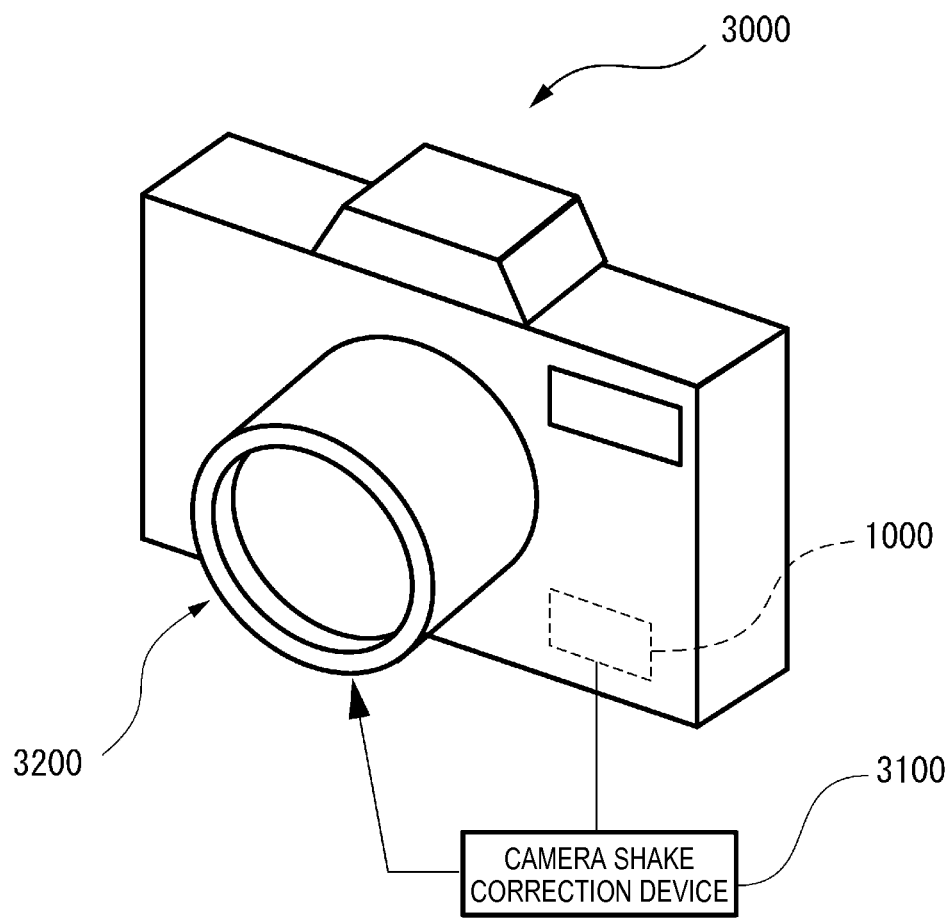
FIG. 11 is a diagram showing the exterior of a digital still camera as an electronic apparatus according to the fifth embodiment.

FIG. 11 is a diagram showing the exterior of a digital still camera 3000 (hereinafter, referred to as a camera 3000). The electronic module 1000 according to the third embodiment which detects the posture of the camera 3000 is embedded in the camera 3000. A detected signal of the embedded electronic module 1000 is supplied to a camera shake correction device 3100. For example, the camera shake correction device 3100 may move a specific lens within a lens set 3200 in accordance with the detected signal of the electronic module 1000 to thereby suppress an image defect due to a camera shake. In addition, the electronic module 1000 and the camera shake correction device 3100 are embedded in a digital video camera, and thus it is possible to correct a camera shake, similar to the camera 3000.

Sixth Embodiment

Figure 12:
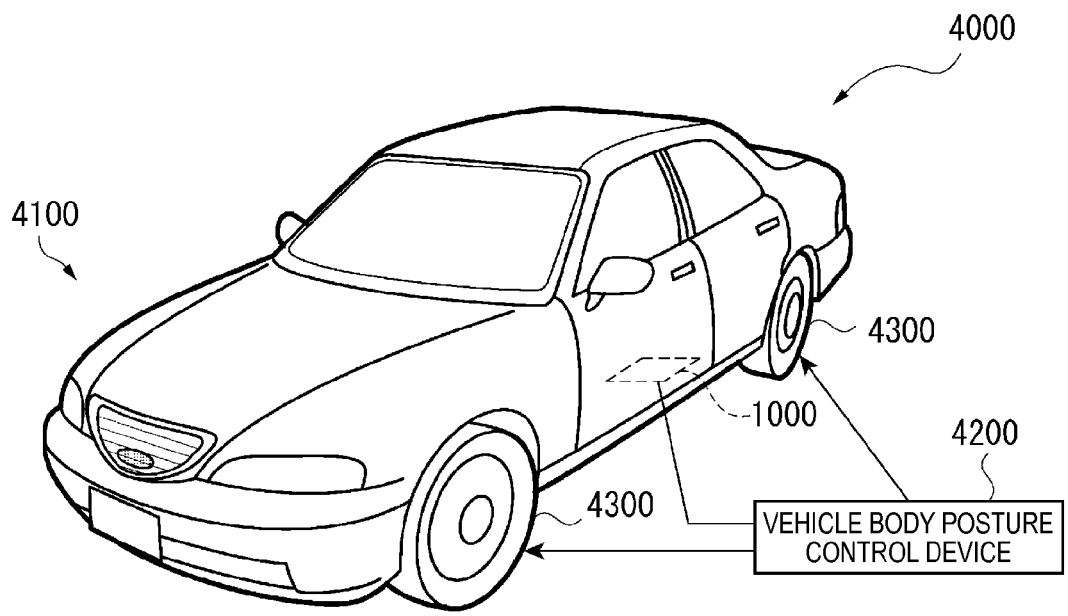
FIG. 12 is a diagram showing the exterior of a vehicle as a moving object according to a sixth embodiment.

A vehicle will be described as a specific example of a moving object according to a sixth embodiment which includes the sensor devices 100, 110, and 120 according to the first embodiment, the sensor device 200 according to the second embodiment, the sensor device 300 according to the third embodiment, or the electronic module 1000 according to the fourth embodiment. FIG. 12 is a diagram showing the exterior of a vehicle 4000 according to the fifth embodiment.

As shown in FIG. 12, the electronic module 1000 according to the third embodiment is embedded in the vehicle 4000. The electronic module 1000 detects the posture of a vehicle body 4100. A detected signal of the electronic module 1000 is supplied to a vehicle body posture control device 4200. The vehicle body posture control device 4200 can compute a posture state of the vehicle body 4100 on the basis of the supplied signal, can control, for example, the hardness and softness of a buffer device (so-called suspension) according to the posture of the vehicle body 4100, and can control a braking force of each vehicle wheel 4300. The posture control using the electronic module 1000 can be used in toys such as a bipedal walking robot, an aircraft, and a radio-controlled helicopter.

What is claimed is:

1. An electronic device comprising:
a first base that has first peripheral edge and first center area;
a second base that has second peripheral edge and second center area, the first peripheral edge of the first base being bonded to the second peripheral edge of the second base at a bonding portion so as to provide first and second accommodation spaces between the first and second base;
a partition wall that is provided at the first center area of the first base and at the second center area of the second base so that the partition wall separates the first accommodation space from the second accommodation space, the partition wall extending in a first direction;
a first functional element that is accommodated in the first accommodation space, the first functional element is configured with first, second, and third members, the first, second, and third members being arranged along the first direction, the first, second, and third members detecting first physical quantities with respect to first, second, and third axes, the second member being sandwiched between the first and third members;
a second functional element that is accommodated in the second accommodation space, the second functional element is configured with fourth, fifth, and sixth members, the fourth, fifth, and sixth members being arranged along the first direction, the fourth, fifth, and sixth members detecting second physical quantities with respect to the first, second, and third axes, the fifth member being sandwiched between the fourth and sixth members;
a first wiring that is electrically and physically connected to each of the first and fourth members, the first wiring outwardly extending from each of the first and fourth members in a second direction parallel to the first direction and toward a first side of the first peripheral edge of the first base;
a second wiring that is electrically and physically connected to each of the third and sixth members, the second wiring outwardly extending from each of the third and sixth members in a third direction parallel to the first and second directions and toward a second side of the first peripheral edge of the first base, the second side of the first peripheral edge being opposite to the first side; and
third and fourth wirings that are electrically and physically connected to each of the second and fifth members, the third wiring outwardly extending from each of the second and fifth members in the second direction and toward the first side of the first peripheral edge of the first base, the fourth wiring outwardly extending from each of the second and fifth members in the third direction and toward the second side of the first peripheral edge of the first base,
wherein the first, second, third, and fourth wirings extend outside of each of the first accommodation space and the second accommodation space via the bonding portion, and
the first accommodation space and the second accommodation space have different internal environments.

2. The electronic device according to claim 1,
wherein at least one of the first, second, third, and fourth wirings includes a plurality of wirings that are provided in a plurality of grooves and sealed by a plurality of sealing members.

3. The electronic device according to claim 1,
wherein the first functional element is an angular velocity sensor, and the second functional element is an acceleration sensor, and
wherein the internal environment of the first accommodation space has a decompressed atmosphere, and the internal environment of the second accommodation space has a barometric atmosphere.

4. The electronic device according to claim 3, wherein the angular velocity sensor detects angular velocity around the first, second, and third axes.

5. The electronic device according to claim 3, wherein the acceleration sensor detects acceleration in directions along the first, second, and third axes.

6. The electronic device according to claim 1,
wherein the first and third wirings overlap with the bonding portion at a first extended area located in the first side of the first peripheral edge of the first base, and the second and fourth wirings overlap with the bonding portion at a second extended area located in the second side of the first peripheral edge of the first base, and
wherein the first extended area and the second extended area are disposed opposite to each other with respect to each of the first and second accommodation spaces.

7. The electronic device according to claim 1,
wherein each of the first, second, third, and fourth wirings configures with a plurality of wirings, and wherein the number of wirings of the plurality of wirings in the first wiring is the same as the number of wirings of the plurality of wirings in the second wiring.

8. A digital still camera comprising:
a camera body having a lens; and
an electronic module that is provided in an inside of the camera body and that has the electronic device according to claim 1.

9. A digital still camera comprising:
a camera body having a lens; and
an electronic module that is provided in an inside of the camera body and that has the electronic device according to claim 2.

10. A digital still camera comprising:
a camera body having a lens; and
an electronic module that is provided in an inside of the camera body and that has the electronic device according to claim 3.

11. A digital still camera comprising:
a camera body having a lens; and
an electronic module that is provided in an inside of the camera body and that has the electronic device according to claim 6.

12. A digital still camera comprising:
a camera body having a lens; and
an electronic module that is provided in an inside of the camera body and that has the electronic device according to claim 7.

13. A vehicle comprising:
a vehicle body;
vehicle wheels; and
an electronic module that is provided in an inside of the vehicle body and that has the electronic device according to claim 1.

14. A vehicle comprising:
a vehicle body;
vehicle wheels; and
an electronic module that is provided in an inside of the vehicle body and that has the electronic device according to claim 2.

15. A vehicle comprising:
a vehicle body;
vehicle wheels; and
an electronic module that is provided in an inside of the vehicle body and that has the electronic device according to claim 3.

16. A vehicle comprising:
a vehicle body;
vehicle wheels; and
an electronic module that is provided in an inside of the vehicle body and that has the electronic device according to claim 6.

17. A vehicle comprising:
a vehicle body;
vehicle wheels; and
an electronic module that is provided in an inside of the vehicle body and that has the electronic device according to claim 7.

* * * * *